(12) United States Patent
Nagamine et al.

(10) Patent No.: US 8,982,614 B2
(45) Date of Patent: Mar. 17, 2015

(54) MAGNETORESISTIVE EFFECT ELEMENT AND MANUFACTURING METHOD THEREOF

(71) Applicant: Kabushiki Kaisha Toshiba, Tokyo (JP)

(72) Inventors: Makoto Nagamine, Tokyo (JP);
Daisuke Ikeno, Yokohama (JP);
Katsuya Nishiyama, Yokohama (JP);
Katsuaki Natori, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/962,918

(22) Filed: Aug. 8, 2013

(65) Prior Publication Data

US 2014/0284592 A1 Sep. 25, 2014

Related U.S. Application Data

(60) Provisional application No. 61/804,511, filed on Mar. 22, 2013.

(51) Int. Cl.
| | |
|---|---|
| *G11C 11/00* | (2006.01) |
| *H01L 29/66* | (2006.01) |
| *H01L 21/00* | (2006.01) |
| *H01L 43/12* | (2006.01) |
| *H01F 10/32* | (2006.01) |
| *H01L 43/08* | (2006.01) |

(52) U.S. Cl.
CPC .............. *H01L 43/12* (2013.01); *H01F 10/32* (2013.01); *H01L 43/08* (2013.01)
USPC .... 365/158; 365/157; 257/421; 257/E29.323; 257/E29.042; 438/3

(58) Field of Classification Search
USPC ...................... 257/5, 9, 529, 248, 4, 421, 314, 257/E29.323, E29.042, E29.179, E21.002, 257/E43.004; 365/158, 17, 189.16; 438/3
See application file for complete search history.

(56) References Cited

U.S. PATENT DOCUMENTS

| | | | |
|---|---|---|---|
| 7,910,914 B2 * | 3/2011 | Tanaka et al. ...................... 257/5 |
| 2006/0056114 A1 | 3/2006 | Fukumoto et al. | |
| 2008/0175032 A1 * | 7/2008 | Tanaka et al. ................... 365/51 |

(Continued)

FOREIGN PATENT DOCUMENTS

| | | |
|---|---|---|
| EP | 2421063 A1 | 2/2012 |
| JP | 2010-097977 A | 4/2010 |

(Continued)

OTHER PUBLICATIONS

Masuda, Hiroaki et. al., "Powder Technology Handbook", 2006, Taylor & Francis Group, p. 243.*

(Continued)

*Primary Examiner* — Evan Pert
*Assistant Examiner* — Gustavo Ramallo
(74) *Attorney, Agent, or Firm* — Holtz, Holtz, Goodman & Chick PC

(57) ABSTRACT

According to one embodiment, a magnetoresistive effect element includes a first ferromagnetic layer, a tunnel barrier provided on the first ferromagnetic layer, and a second ferromagnetic layer provided on the tunnel barrier. The tunnel barrier includes a nonmagnetic mixture containing MgO and a metal oxide with a composition which forms, in a solid phase, a single phase with MgO.

11 Claims, 17 Drawing Sheets

(56) References Cited

U.S. PATENT DOCUMENTS

| | | |
|---|---|---|
| 2009/0080238 A1* | 3/2009 | Yoshikawa et al. ............ 365/158 |
| 2009/0257151 A1* | 10/2009 | Zhang et al. ............... 360/324.2 |
| 2011/0084348 A1 | 4/2011 | Kuribayashi et al. |
| 2012/0061779 A1 | 3/2012 | Ohmori et al. |
| 2012/0061781 A1 | 3/2012 | Ohmori et al. |
| 2012/0091548 A1* | 4/2012 | Sukegawa et al. ............ 257/421 |
| 2012/0241881 A1 | 9/2012 | Daibou et al. |

FOREIGN PATENT DOCUMENTS

| | | |
|---|---|---|
| JP | 2010-109208 A | 5/2010 |
| JP | 4834834 B2 | 12/2011 |
| JP | 2012-124185 A | 6/2012 |

OTHER PUBLICATIONS

Related U.S. Appl. No. 13/961,805 ; First Named Inventor: Makoto Nagamine; Title: "Magnetoresistive Effect Element and Manufacturing Method Thereof "; Filed: Aug. 7, 2013.

Hiroaki Sukegawa et al.; "Applied Physics Letter: Tunnel magnetoresistance with improved bias voltage dependence in lattice-matched Fe/spinel $MgAl_2O_4$/Fe(001) junctions"; vol. 96; American Institute of Physics; 2010; pp. 212505 to 1-212505-3.

Anna E. Mchale et al.; "Phase Equilibria Diagrams; Phase Diagrams for Ceramists "; The American Ceramic Society; 1993; Annual 93; pp. 9-10, 14-18, 20, 75-77, 95-96 and 168-170; Westerville, Ohio, U.S.A.

Bjorn O. Mysen et al.; "Phase Diagrams for Ceramists"; The American Ceramic Society; vol. 8; 1990; pp. 24-25; Westerville, Ohio, U.S.A.

Robert S. Roth et al.; "Phase Diagrams for Ceramists"; The American Ceramic Society; vol. 6; 1987; pp. 3-4, 116, 119-127, 129, 138-139, 160, 187, 191-193, 264, 296-297, 338-341, 358-363 and 393; Westerville, Ohio, U.S.A.

Ernest M. Levin et al.; "Phase Diagrams for Ceramists"; The American Ceramic Society; vol. 3; 1975; pp. 19-20, 50-52, 100-101, 111-112, 114-119, 158, 167, 170, 225-226, 237-243 and 425; Columbus, Ohio, U.S.A.

Allen M. Alper et al..' "Phase Diagrams; Materials Science and Technology"; vol. 4; 1976; pp. 182-183 and190-191; Academic Press.

Robert S. Roth et al.; "Phase Diagrams for Ceramists"; The American Ceramic Society; vol. 4; 1981; pp. 30, 92-93, 99-104, 114-116, 200-204 and 213-217; Columbus, Ohio, U.S.A.

Robert S. Roth et al.; "Phase Equilibria Diagrams"; The American Ceramic Society; vol. 14: Oxides; 2005; pp. 170-171, 178-182 ,199-203, 265-267, 390-394, 419, 438-442, 452-454, 458-463, 467-468, 590, 593 and 625-632.

Ernest M. Levin et al.; "Phase Diagrams for Ceramists"; The American Ceramic Society; vol. 2 ;1969; pp. 11-13, 35-37, 40-41, 46-48, 87-89, 92-94, 145, 152, 208 and 532; Columbus, Ohio, U.S.A.

Ernest M. Levin et al.;"Phase Diagrams for Ceramists"; The American Ceramic Society; vol. 1; 1964; pp. 51-52, 54-56, 62, 65-67, 69, 98-99, 102, 110-114, 119-120, 123, 126, 142-143, 214, 242-251 and 527; Colombus, Ohio, U.S.A.

Anna E. Mchale et al.; "Phase Equilibria Diagrams; Phase Diagrams for Ceramists"; The American Ceramic Society; Annual 92; 1992; p. 3; Westerville, Ohio, U.S.A.

Anna E. Mchale et al.; "Phase Equilibria Diagrams"; The American Ceramic Society; vol. 12: Oxides; 1996; pp. 83-84, 96, 118-120, 225, 232-234, 236 and 357-358; Westerville, Ohio, U.S.A.

Robert S. Roth et al.; "Phase Equilibria Diagrams; Phase Diagrams for Ceramists"; The American Ceramic Society; vol. 11: Oxides; 1995; pp. 70, 76-77, 86-88, 90-91, 100-101, 154, 177-178, 263, 327, 332-335, 390 and 447-448; Westerville, Ohio, U.S.A.

Suzuki, et al., "Hybrid magnetic tunnel junction/ spin filter device", Proc. of Spie vol. 7036 (2008).

* cited by examiner

MgO-TiO2
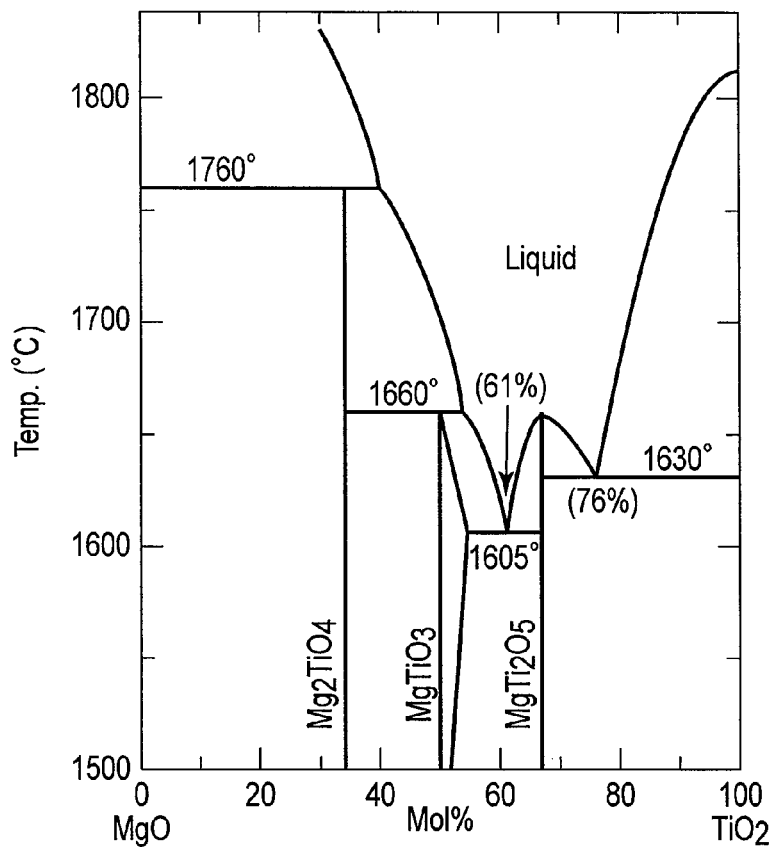
F I G. 1
MgO-ZnO
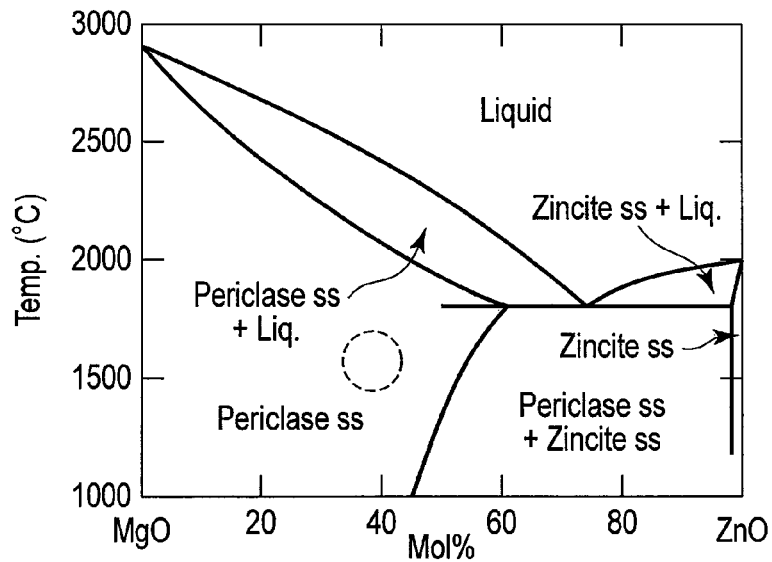
F I G. 2

FIG. 4

| | | | | | | | | | | | | | | | | | |
|---|---|---|---|---|---|---|---|---|---|---|---|---|---|---|---|---|---|
| | H | | | | | | | | | | | | | | | | He |
| Cubic system | | - | | | | | | | | | | BeO 1-216 | C | N | O | F | Ne |
| Another system | Li | | | | | | | | | | | | | | | | |
| Radius | | | | | | | | | | | | 1.11 | | | | | |
| Cubic system | Na | MgO ref | | | | | | | | | | Al₂O₃ 1-259 | SiO₂ 1-266 | P₂O₅ 1-272 | S | Cl | Ar |
| Another system | | | | | | | | | | | | | SiO₂ 1-266 | | | | |
| Radius | | 1.60 | | | | | | | | | | 1.43 | | | | | |
| Cubic system | CaO 1-229 | ScO None | TiO 14-11392 | VO None | CrO None | MnO, Mn₂O₃ 11-9238, None | FeO 1-63 | CoO 1-51 | NiO 1-258 | CuO 1-274 | ZnO 2-2312 | Ga₂O₃ *1 | GeO₂ 1-284 | As | SeO₂ | Br | Kr |
| Another system | K | Sc₂O₃ 4-5156 | TiO₂ 92-003 | V₂O₃, V₂O₅ 3-4335, 3-4341 | Cr₂O₃ 1-262 | MnO₂ 6-6737 | Fe₂O₃ 1-64 | | | Cu₂O 93-220 | | | | | None | | |
| Radius | 1.97 | 1.63 | 1.45 | 1.31 | 1.25 | 1.12 | 1.24 | 1.25 | 1.25 | 1.28 | 1.33 | 1.22 | | | | | |
| Cubic system | SrO 13-10366 | Y₂O₃ 4-5156 | ZrO₂ 1-271 | NbO 14-11390 | MoO₃ 13-10374 | Tc | Ru | Rh | Pd | Ag | CdO None | In₂O₃ None | SnO₂ 6-6405 | Sb₂O₃ None | TeO₂ 4-5161 | I | Xe |
| Another system | Rb | | | | Nb₂O₅ 6-6406 | | | | | 93-029 | | | | | | | |
| Radius | 2.15 | 1.78 | 1.59 | 1.43 | 1.36 | | | | | | 1.49 | 1.63 | 1.41 | 1.45 | | | |
| Cubic system | BaO 13-10339 | La₂O₃ None | HfO₂ 4-5159 | TaO None | WO₃ 2-2320 | Re | Os | Ir | Pt | Au | Hg | Tl | Pb | Bi₂O₃ 1-326 | Po | At | Rn |
| Another system | Cs | | | | Ta₂O₅ 1-273 | | | | | | | | | | | | |
| Radius | 2.17 | 1.87 | 1.56 | 1.43 | 1.37 | | | | | | | | | 1.56 | | | |
| Cubic system | | CeO₂ None | | | | | | | | | | | | | | | |
| Another system | Fr | Ac | | | | | | | | | | | | | | | |
| Radius | Ra | 1.83 | | | | | | | | | | | | | | | |

Lanthanides/Actinides:

| Pr | Nd | Pm | Sm₂O₃ 3-4334 | EuO None | Gd₂O₃ 3-4333 | Tb₂O₃ None | Dy₂O₃ 3-4332 | HoO None | Er₂O₃ 4-5155 | TmO None | Yb₂O₃ 4-5157 | LuO None |
|---|---|---|---|---|---|---|---|---|---|---|---|---|
| PrO None | Nd₂O₃ None | | | | | | | | | | | |
| 1.82 | 1.81 | | 1.79 | 1.98 | 1.79 | 1.76 | 1.75 | 1.74 | 1.73 | 1.72 | 1.94 | 1.72 |

Legend:
- Forming, in a solid phase, a single phase with MgO
- Not forming, in a solid phase, a single phase with MgO
- Unknown
- Not applicable

| Oxide | Metallic bond radius(Å) |
|---|---|
| MgO | 1.60 |
| TiO | 1.45 |
| $TiO_2$ | 1.45 |
| MnO | 1.12 |
| ZnO | 1.33 |

| No | Material | XO Structure type | Misfit (%) | MgO-XO Single phase in solid phase | MgO-XO Phase diagram reference | XO-TiO2 Single phase in solid phase | XO-TiO2 Phase diagram reference | MgO-XO-TiO2 Single phase in solid phase | MgO-XO-TiO2 Phase diagram reference | XO-ZnO Single phase in solid phase | XO-ZnO Phase diagram reference | MgO-XO-ZnO Single phase in solid phase | MgO-XO-ZnO Phase diagram reference | XO-MnO Single phase in solid phase | XO-MnO Phase diagram reference | MgO-XO-MnO Single phase in solid phase | MgO-XO-MnO Phase diagram reference |
|---|---|---|---|---|---|---|---|---|---|---|---|---|---|---|---|---|---|
| 0 | MgO | NaCl | 3.8 | - | - | - | - | - | - | - | - | - | - | - | - | - | - |
| 1 | SiO2 | - | 13.6 | × | 1-266 | × | 12-9953 | × | 12-10091 | × | 1-302 | × | 2-2520 | × | 1-101 | ○ | 1-699 |
| 2 | CaO | NaCl | -15.1 | × | 1-229 | Unknown | None | × | 4-5380 | Unknown | None | Unknown | None | ○ | 11-9219 | ○ | 4-5374 |
| 3 | ScO | NaCl | -10.3 | Unknown | None | Unknown | None | Unknown | None | Unknown | None | Unknown | None | Unknown | None | Unknown | None |
| 4 | TiO | NaCl | -3.1 | ○ | 14-11392 | ○ | 14-11392 | Unknown | 14-11392 | Unknown | None | Unknown | None | Unknown | None | Unknown | None |
| 5 | VO | NaCl | -0.9 | Unknown | None | Unknown | None | Unknown | None | Unknown | None | Unknown | None | Unknown | None | Unknown | None |
| 6 | CrO | NaCl | -1.1 | Unknown | None | Unknown | None | Unknown | None | Unknown | None | Unknown | None | Unknown | None | Unknown | None |
| 7 | Mn2O3 | Tl2O3 | -13.9 | Unknown | None | × | None | Unknown | None | Unknown | None | Unknown | None | ○ | 11-9597 | ○ | 11-9597 |
| 8 | FeO | NaCl | -6.3 | × | 1-63 | × | 2-2169 | × | 4-5406 | × | 13-10637 | Unknown | None | ○ | 2-2157 | Unknown | None |
| 9 | CoO | NaCl | -4.9 | × | 1-51 | × | 3-4324 | Unknown | None | ○ | 1-56 | Unknown | None | ○ | 11-9232 | Unknown | None |
| 10 | NiO | NaCl | -3.0 | × | 1-258 | × | 6-6415 | Unknown | None | Unknown | None | Unknown | None | × | 12-9918 | Unknown | None |
| 11 | Cu2O | - | -5.1 | Unknown | 1-274 | Unknown | | Unknown | None | Unknown | None | Unknown | None | Unknown | None | Unknown | None |
| 12 | SrO | NaCl | 12.1 | × | 13-10366 | × | 1-297 | Unknown | None | Unknown | None | Unknown | None | Unknown | 3-4224 | Unknown | None |
| 13 | NbO | NbO | -3.8 | Unknown | 14-11390 | Unknown | None | Unknown | None | Unknown | None | Unknown | None | Unknown | None | Unknown | None |
| 14 | CdO | NaCl | -13.7 | Unknown | None | Unknown | None | Unknown | None | Unknown | None | Unknown | None | Unknown | None | Unknown | None |
| 15 | Sb2O3 | As2O3 | 9.0 | Unknown | None | × | 1-213 | Unknown | 11-9501 | Unknown | None | Unknown | None | Unknown | None | Unknown | None |
| 16 | BaO | NaCl | 4.1 | × | 13-10339 | Unknown | None | Unknown | None | Unknown | None | Unknown | None | Unknown | 3-4176 | Unknown | None |
| 17 | CeO2 | CaF2 | 5.9 | Unknown | None | Unknown | None | Unknown | None | Unknown | None | Unknown | None | Unknown | None | Unknown | None |
| 18 | EuO | NaCl | 11.4 | Unknown | None | Unknown | None | Unknown | None | Unknown | None | Unknown | None | Unknown | None | Unknown | None |

FIG. 10

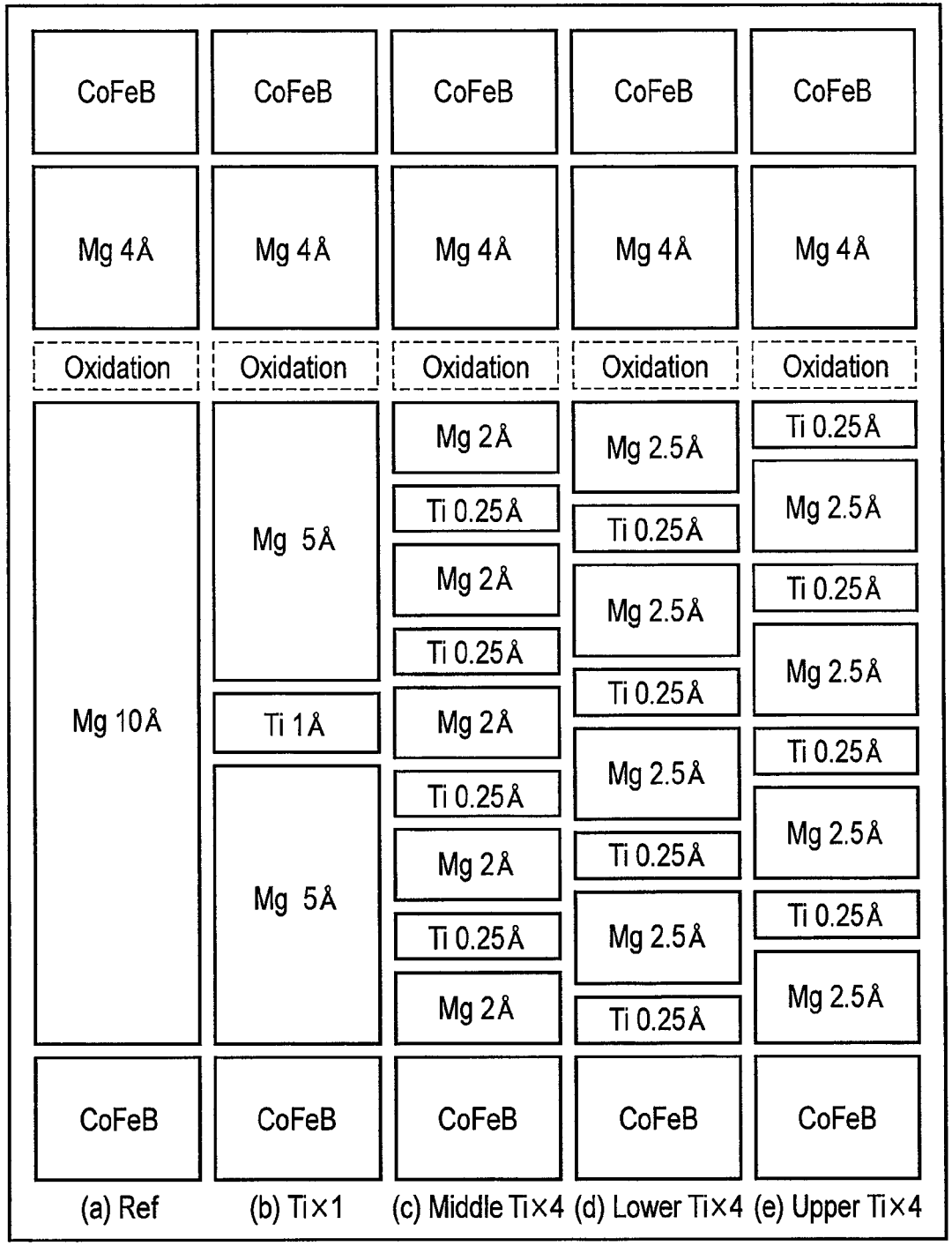
F I G. 11

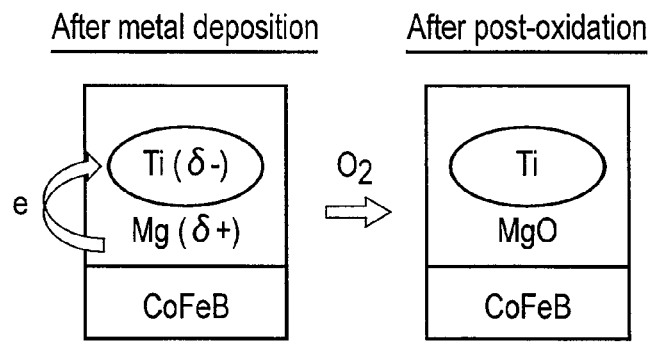
F I G. 13
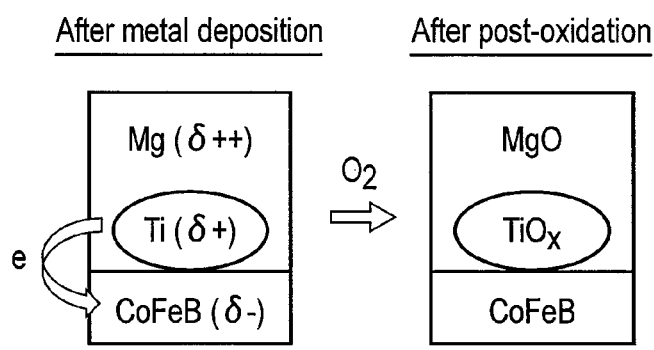
F I G. 14
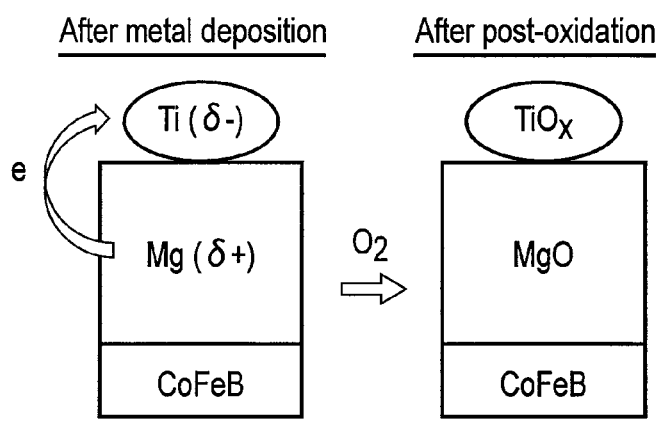
F I G. 15

FIG. 16

| No | Metal | Standard electrode potential (V) | | No | Metal | Standard electrode potential (V) | | No | Metal | Standard electrode potential (V) | |
|---|---|---|---|---|---|---|---|---|---|---|---|
| 1 | Sr | -4.1, -2.89 | Sr+ + e = Sr, Sr2+ + 2e = Sr | 16 | Dy | -2.295, -2.2 | Dy3+ + 3e = Dy, Dy2+ + 2e = Dy | 46 | Ge | 0.124, 0.24 | Ge2+ + 2e = Ge, Ge4+ + 4e = Ge |
| 2 | Ca | -3.80, -2.868 | Ca+ + e = Ca, Ca2+ + 2e = Ca | 17 | Lu | -2.28 | Lu3+ + 3e = Lu | 47 | Re | 0.300 | Re3+ + 3e = Re |
| 3 | Ba | -2.912 | Ba2+ + 2e = Ba | 18 | Tb | -2.28 | Tb3+ + 3e = Tb | 48 | Bi | 0.308, 0.5 | Bi3+ + 3e = Bi, Bi+ + e = Bi |
| 4 | Eu | -2.812, -1.991 | Eu2+ + 2e = Eu, Eu3+ + 3e = Eu | 19 | Gd | -2.279 | Gd3+ + 3e = Gd | 49 | Cu | 0.3419, 0.521 | Cu2+ + 2e = Cu, Cu+ + e = Cu |
| 5 | Yb | -2.76, -2.19 | Yb2+ + 2e = Yb, Yb3+ + 3e = Yb | 20 | Nd | -2.1 | Nd2+ + 2e = Nd | 50 | Ru | 0.455 | Ru2+ + 2e = Ru |
| 6 | (Mg) | -2.70, -2.372 | Mg+ + e = Mg, Mg2+ + 2e = Mg | 21 | Sc | -2.077 | Sc3+ + 3e = Sc | 51 | Rh | 0.600, 0.758 | Rh(2,1)+ + (2,1)e = Rh, Rh3+ + 3e = Rh |
| 7 | Sm | -2.68, -2.304 | Sm2+ + 2e = Sm, Sm3+ + 3e = Sm | 22 | Th | -1.899 | Th4+ + 4e = Th | 52 | Ag | 0.7996 | Ag+ + e = Ag |
| 8 | Tm | -2.4, -2.319 | Tm2+ + 2e = Tm, Tm3+ + 3e = Tm | 23 | Be | -1.847 | Be2+ + 2e = Be | 53 | Pd | 0.951 | Pd2+ + 2e = Pd |
| 9 | La | -2.379 | La3+ + 3e = La | 24 | Al | -1.662 | Al3+ + 3e = Al | 54 | Ir | 1.156 | Ir3+ + 3e = Ir |
| 10 | Y | -2.372 | Y3+ + 3e = Y | 25 | (Ti) | -1.63, -1.37 | Ti2+ + 2e = Ti, Ti3+ + 3e = Ti | 55 | Pt | 1.18 | Pt2+ + 2e = Pt |
| 11 | Pr | -2.353, -2.0 | Pr3+ + 3e = Pr, Pr2+ + 2e = Pr | 26 | Hf | -1.55 | Hf4+ + 4e = Hf | 56 | Au | 1.498, 1.692 | Au3+ + 3e = Au, Au+ + e = Au |
| 12 | Ce | -2.336 | Ce3+ + 3e = Ce | 27 | Pa | -1.49, -1.34 | Pa4+ + 4e = Pa, Pa3+ + 3e = Pa | | | | |
| 13 | Er | -2.331, -2.0 | Er3+ + 3e = Er, Er2+ + 2e = Er | 28 | Zr | -1.45 | Zr4+ + 4e = Zr | | | | |
| 14 | Ho | -2.33, -2.1 | Ho3+ + 3e = Ho, Ho2+ + 2e = Ho | 29 | (Mn) | -1.185 | Mn2+ + 2e = Mn | | | | |
| 15 | Nd | -2.323 | Nd3+ + 3e = Nd | 30 | V | -1.175 | V2+ + 2e = V | | | | |
| | | | | 31 | Nb | -1.099 | Nb3+ + 3e = Nb | | | | |
| | | | | 32 | Cr | -0.913, -0.744 | Cr2+ + 2e = Cr, Cr3+ + 3e = Cr | | | | |
| | | | | 33 | (Zn) | -0.7618 | Zn2+ + 2e = Zn | | | | |
| | | | | 34 | Ta | -0.6 | Ta3+ + 3e = Ta | | | | |
| | | | | 35 | Ga | -0.549, -0.2 | Ga3+ + 3e = Ga, Ga+ + e = Ga | | | | |
| | | | | 36 | (Fe) | -0.447, -0.037 | Fe2+ + 2e = Fe, Fe3+ + 3e = Fe | | | | |
| | | | | 37 | Cd | -0.403 | Cd2+ + 2e = Cd | | | | |
| | | | | 38 | In | -0.3382, -0.14 | In3+ + 3e = In, In+ + e = In | | | | |
| | | | | 39 | Tl | -0.336, 0.741 | Tl+ + e = Tl, Tl3+ + 3e = Tl | | | | |
| | | | | 40 | (Co) | -0.28 | Co2+ + 2e = Co | | | | |
| | | | | 41 | Ni | -0.257 | Ni2+ + 2e = Ni | | | | |
| | | | | 42 | Mo | -0.200 | Mo3+ + 3e = Mo | | | | |
| | | | | 43 | Sn | -0.1375 | Sn2+ + 2e = Sn | | | | |
| | | | | 44 | Pb | -0.1262 | Pb2+ + 2e = Pb | | | | |
| | | | | 45 | W | 0.1 | W3+ + 3e = W | | | | |

1.07V

| No | XO | | | MgO-XO-TiO2 | | | | MgO-XO-ZnO | | | | MgO-XO-MnO | | | |
|---|---|---|---|---|---|---|---|---|---|---|---|---|---|---|---|
| | Material | Structure type | Misfit (%) | Single phase in solid phase | Standard electrode potential (V) | | | Single phase in solid phase | Standard electrode potential (V) | | | Single phase in solid phase | Standard electrode potential (V) | | |
| | | | | | Mg | X | Ti | | Mg | X | Zn | | Mg | X | Mn |
| 0 | MgO | NaCl | -3.8 | - | -2.7 | - | -1.63 | - | -2.7 | - | -0.7618 | - | -2.7 | - | -1.185 |
| 1 | SiO2 | - | 13.6 | × | -2.7 | Nonmetallic | -1.63 | × | -2.7 | Nonmetallic | -0.7618 | ○ | -2.7 | Nonmetallic | -1.185 |
| 2 | CaO | NaCl | -15.1 | × | -2.7 | -3.8 | -1.63 | Unknown | -2.7 | -3.8 | -0.7618 | ○ | -2.7 | -3.8 | -1.185 |
| 3 | ScO | NaCl | -10.3 | Unknown | -2.7 | -2.077 | -1.63 | Unknown | -2.7 | -2.077 | -0.7618 | Unknown | -2.7 | -2.077 | -1.185 |
| 4 | TiO | NaCl | -3.1 | ○ | -2.7 | -1.63 | -1.63 | Unknown | -2.7 | -1.63 | -0.7618 | Unknown | -2.7 | -1.63 | -1.185 |
| 5 | VO | NaCl | -0.9 | Unknown | -2.7 | -1.175 | -1.63 | Unknown | -2.7 | -1.175 | -0.7618 | Unknown | -2.7 | -1.175 | -1.185 |
| 6 | CrO | NaCl | -1.1 | Unknown | -2.7 | -0.913 | -1.63 | Unknown | -2.7 | -0.913 | -0.7618 | ○ | -2.7 | -0.913 | -1.185 |
| 7 | Mn2O3 | Tl2O3 | -13.9 | × | -2.7 | -1.185 | -1.63 | Unknown | -2.7 | -1.185 | -0.7618 | Unknown | -2.7 | -1.185 | -1.185 |
| 8 | FeO | NaCl | -6.3 | Unknown | -2.7 | -0.447 | -1.63 | Unknown | -2.7 | -0.447 | -0.7618 | Unknown | -2.7 | -0.447 | -1.185 |
| 9 | CoO | NaCl | -4.9 | Unknown | -2.7 | -0.28 | -1.63 | Unknown | -2.7 | -0.28 | -0.7618 | Unknown | -2.7 | -0.28 | -1.185 |
| 10 | NiO | NaCl | -3.0 | Unknown | -2.7 | -0.257 | -1.63 | Unknown | -2.7 | -0.257 | -0.7618 | Unknown | -2.7 | -0.257 | -1.185 |
| 11 | Cu2O | - | -5.1 | Unknown | -2.7 | 0.3419 | -1.63 | Unknown | -2.7 | 0.3419 | -0.7618 | Unknown | -2.7 | 0.3419 | -1.185 |
| 12 | SrO | NaCl | 12.1 | Unknown | -2.7 | -4.1 | -1.63 | Unknown | -2.7 | -4.1 | -0.7618 | Unknown | -2.7 | -4.1 | -1.185 |
| 13 | NbO | NbO | -3.8 | Unknown | -2.7 | -1.099 | -1.63 | Unknown | -2.7 | -1.099 | -0.7618 | Unknown | -2.7 | -1.099 | -1.185 |
| 14 | CdO | NaCl | -13.7 | Unknown | -2.7 | -0.403 | -1.63 | Unknown | -2.7 | -0.403 | -0.7618 | Unknown | -2.7 | -0.403 | -1.185 |
| 15 | Sb2O3 | As2O3 | 9.0 | Unknown | -2.7 | Nonmetallic | -1.63 | Unknown | -2.7 | Nonmetallic | -0.7618 | Unknown | -2.7 | Nonmetallic | -1.185 |
| 16 | BaO | NaCl | 4.1 | Unknown | -2.7 | -2.912 | -1.63 | Unknown | -2.7 | -2.912 | -0.7618 | Unknown | -2.7 | -2.912 | -1.185 |
| 17 | CeO2 | CaF2 | 5.9 | Unknown | -2.7 | -2.336 | -1.63 | Unknown | -2.7 | -2.336 | -0.7618 | Unknown | -2.7 | -2.336 | -1.185 |
| 18 | EuO | NaCl | 11.4 | Unknown | -2.7 | -2.812 | -1.63 | Unknown | -2.7 | -2.812 | -0.7618 | Unknown | -2.7 | -2.812 | -1.185 |

F I G. 17

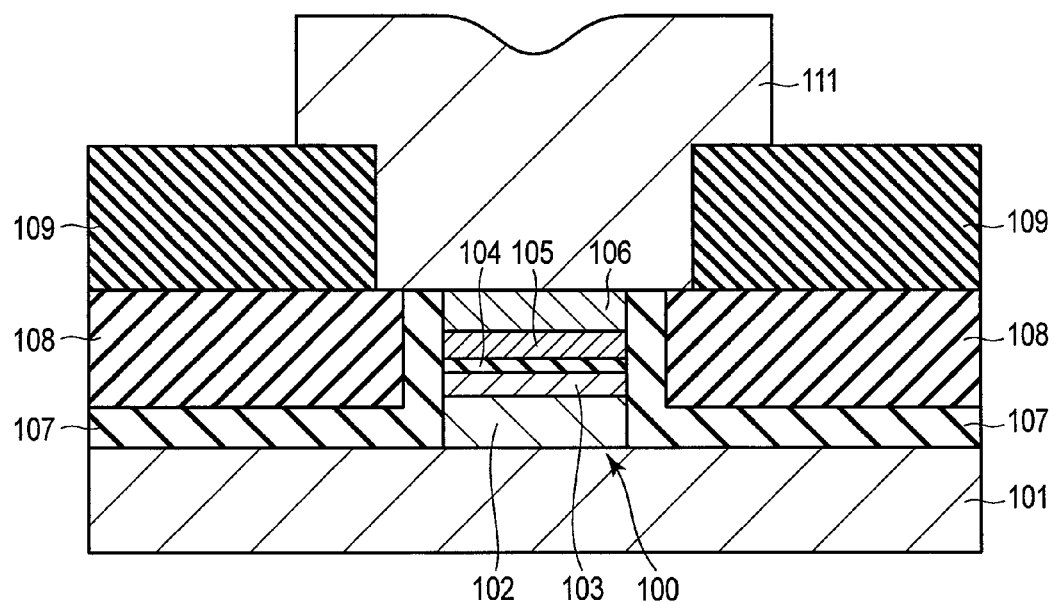
F I G. 18

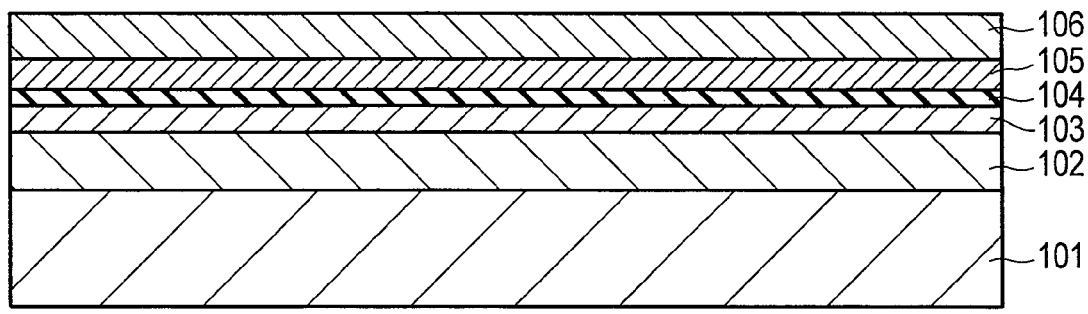
F I G. 19
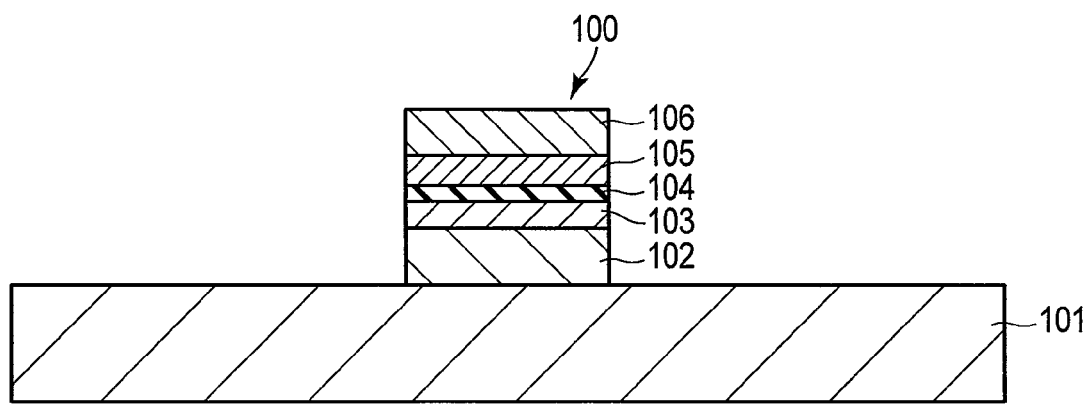
F I G. 20

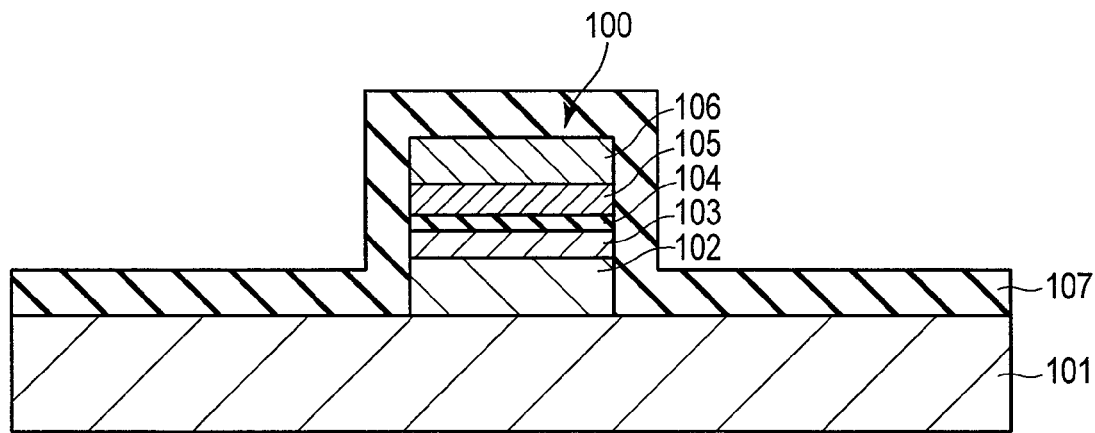
F I G. 21
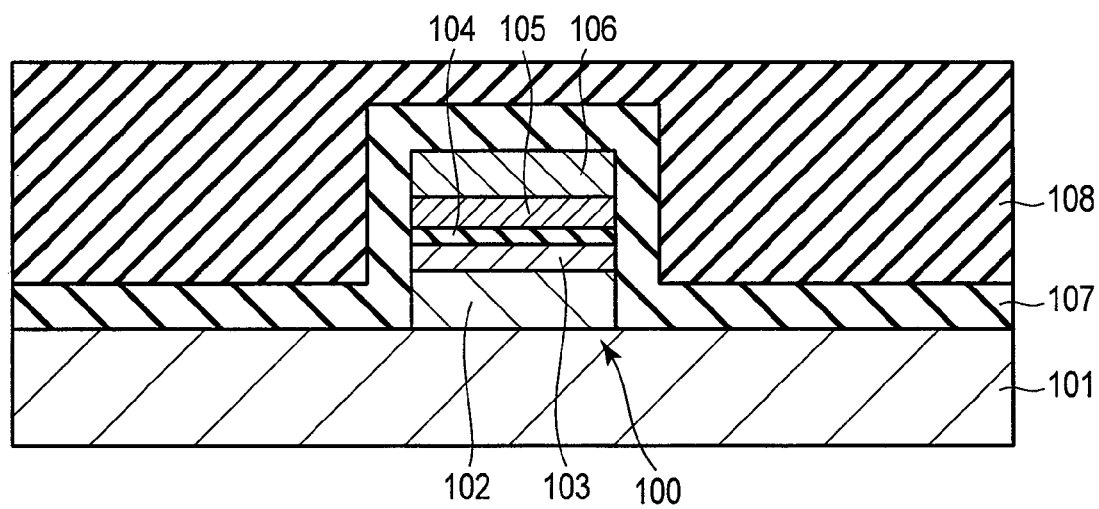
F I G. 22

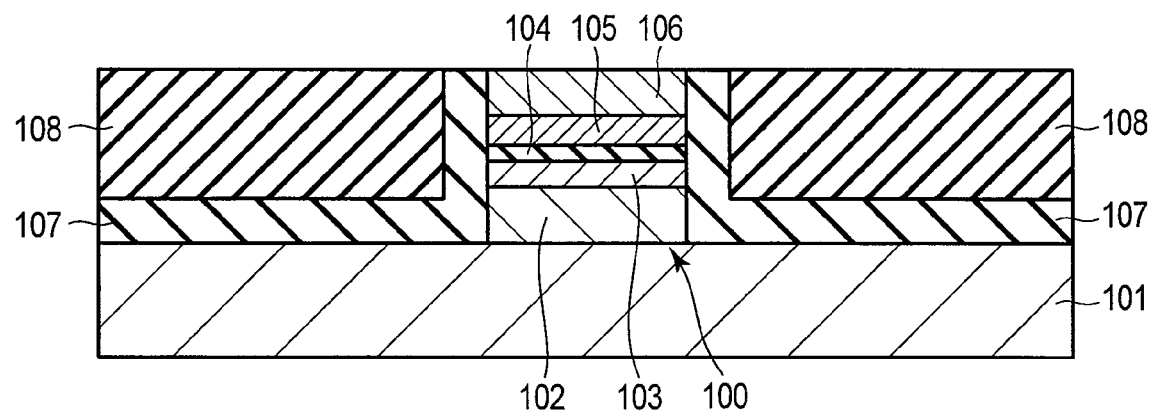
F I G. 23
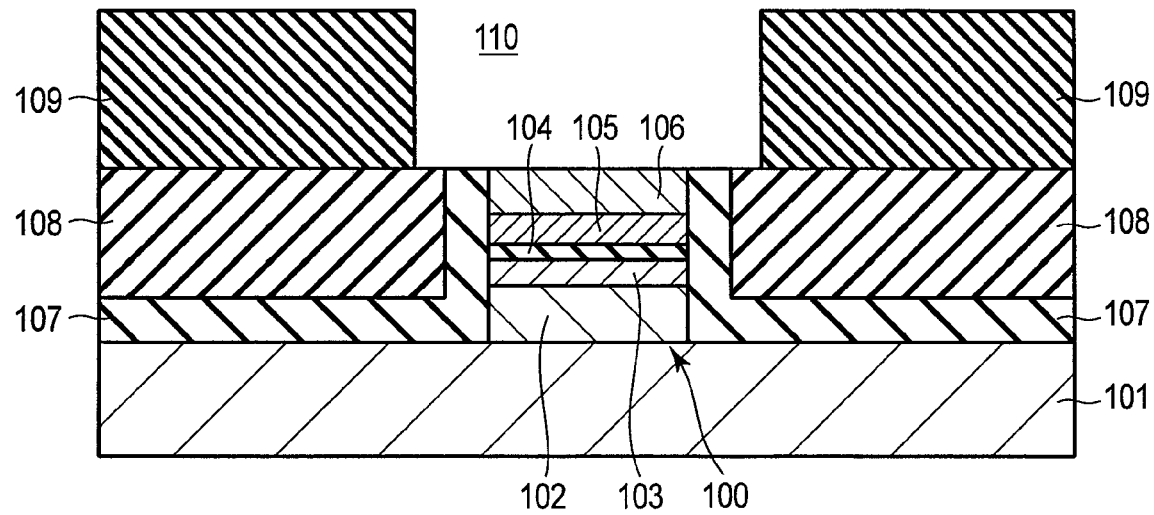
F I G. 24

MAGNETORESISTIVE EFFECT ELEMENT AND MANUFACTURING METHOD THEREOF

CROSS-REFERENCE TO RELATED APPLICATIONS

This application claims the benefit of U.S. Provisional Application No. 61/804,511, filed Mar. 22, 2013, the entire contents of which are incorporated herein by reference.

FIELD

Embodiments described herein relate generally to a magnetoresistive effect element and a manufacturing method thereof.

BACKGROUND

An MRAM (Magnetic Random Access Memory) is a memory device using a magnetic element having the magnetoresistive effect as a memory cell for storing information, and is attracting attention as a next generation, high speed, large capacity nonvolatile memory device. The magnetoresistive effect is a phenomenon in which when a magnetic field is applied to a ferromagnetic material, the electrical resistance changes in accordance with the magnetization direction in the ferromagnetic material. The MRAM can be operated as a memory device by recording information by using the magnetization direction in the ferromagnetic material, and reading the information in accordance with the magnitude of the corresponding electrical resistance. Recently, it has become possible to obtain a very high magnetoresistance ratio (MR ratio) of 100% or more by the tunneling magnetoresistive (TMR) effect. As a consequence, a large capacity MRAM including a magnetic tunnel junction (MTJ) element using the TMR effect is regarded as promising and attracting attention.

BRIEF DESCRIPTION OF THE DRAWINGS

FIG. 1 is a phase diagram of a mixture $MgO-TiO_2$;
FIG. 2 is a phase diagram of a mixture MgO—ZnO;
FIG. 4 is a diagram showing whether MgO and each of various oxides form, in a solid phase, a single phase;
FIG. 10 is a diagram illustrating whether or not three types of oxides including MgO form, in a solid phase, a single phase;
FIG. 11 is a schematic diagram illustrating methods for manufacturing an MTJ element used in experiments;
FIG. 13 is a schematic diagram illustrating the results of the experiment in FIG. 11(c);
FIG. 14 is a schematic diagram illustrating the results of the experiment in FIG. 11(d);
FIG. 15 is a schematic diagram illustrating the results of the experiment in FIG. 11(e);
FIG. 16 is a diagram showing standard electrode potentials of metals;
FIG. 17 is a diagram showing standard electrode potentials of ternary mixtures;
FIG. 18 is a cross-sectional view of an MTJ element 100;
FIG. 19 is a diagram illustrating a method for manufacturing an MTJ element;
FIG. 20 is a diagram illustrating the method for manufacturing an MTJ element;
FIG. 21 is a diagram illustrating the method for manufacturing an MTJ element;
FIG. 22 is a diagram illustrating the method for manufacturing an MTJ element;
FIG. 23 is a diagram illustrating the method for manufacturing an MTJ element;
and
FIG. 24 is a diagram illustrating the method for manufacturing an MTJ element.

DETAILED DESCRIPTION

Figure 3:
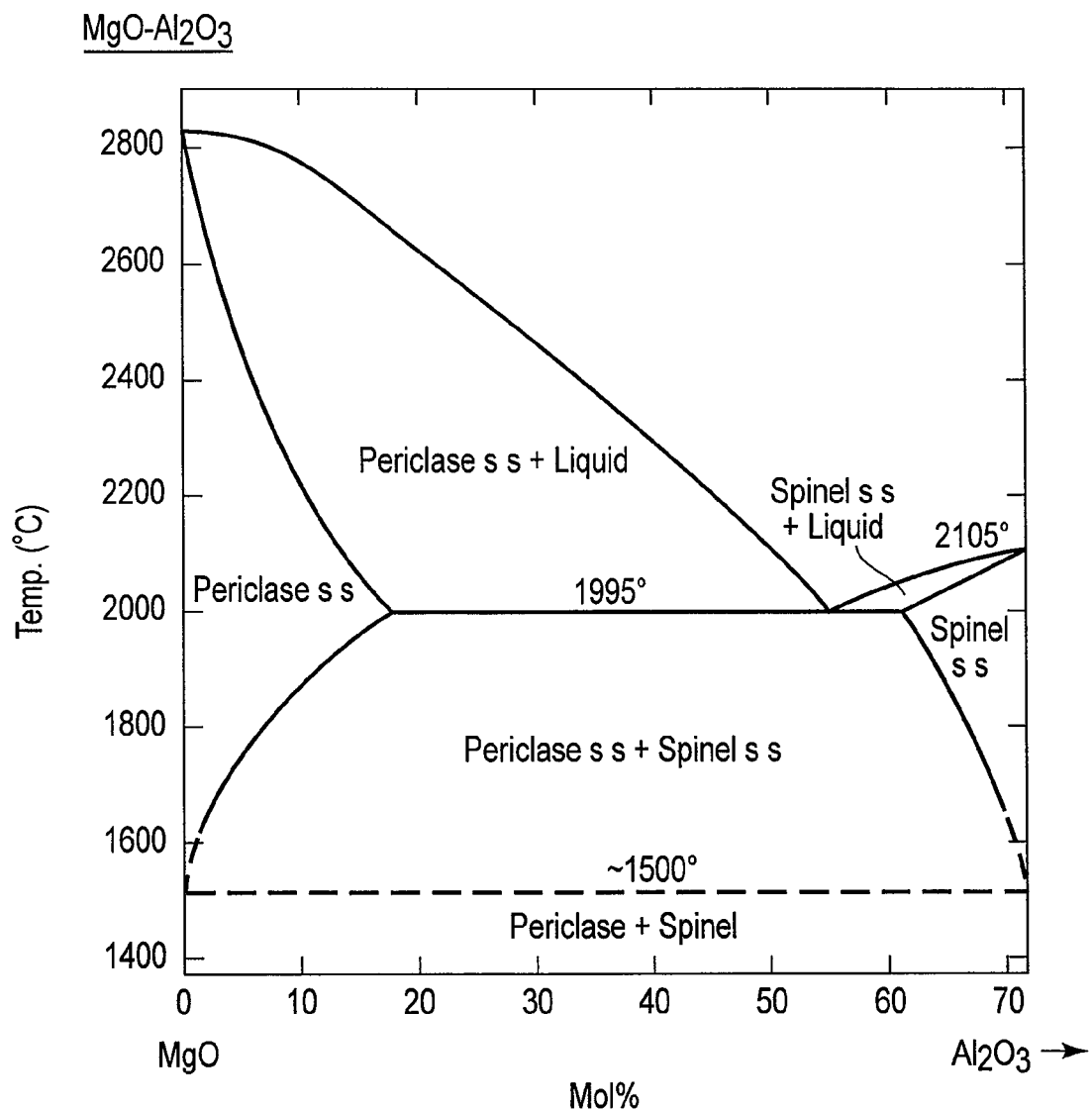
FIG. 3 is a phase diagram of a mixture $MgO-Al_2O_3$.

In general, according to one embodiment, there is provided a magnetoresistive effect element comprising:
a first ferromagnetic layer;
a tunnel barrier provided on the first ferromagnetic layer; and
a second ferromagnetic layer provided on the tunnel barrier,
wherein the tunnel barrier includes a nonmagnetic mixture containing MgO and a metal oxide with a composition which forms, in a solid phase, a single phase with MgO.

The embodiment of the present invention will be explained below with reference to the accompanying drawings. Note that in the following explanation, the same reference numerals denote elements having the same functions and arrangements, and a repetitive explanation will be made only when necessary.

[1. Consideration]

In a ferromagnetic tunnel junction (CoFeB/MgO/CoFeB) containing a sandwich structure with a tunnel barrier (MgO) sandwiched between two ferromagnetic layers (CoFeB), CoFeB is amorphous immediately after deposition. When annealing is performed to the ferromagnetic tunnel junction, boron (B) diffuses, and an alloy containing cobalt (Co) and iron (Fe) is oriented together with MgO in the (001) plane. Therefore, the spin filter effect of a Δ1 band is produced to increase the MR ratio. In the (001)-oriented state, MgO has a lattice constant of 4.21117 Å, and the lattice constant of Fe(001) multiplied by $\sqrt{2}$ is 4.0537 Å. Therefore, MgO is expected to be distorted such that the lattice constant of MgO is larger by 3.8% than that of CoFeB. To further promote the (001) orientation to increase the MR ratio, for example, an oxide is effectively added to MgO to promote the (001) orientation of MgO and CoFeB. The MR (Magnetoresistance) ratio is expressed by "Rap−Rp/Rp" where the resistance value of an MTJ element in a high resistance state is denoted by Rap, and the resistance value of the MTJ element in a low resistance state is denoted by Rp.

Japanese Patent No. 4834834 discloses a method of using a mixture of oxides such as MgZnO, MgCaO, MgSrO, MgBaO, or MgCdO as a tunnel barrier. However, to allow MgO and ZnO to form, in a solid phase, a single phase, the concentration of ZnO needs to be 44% or less (see FIG. 2 described below). Furthermore, "Phase Diagrams for Ceramists", the American Ceramic Society (1967-1993), volume 1, FIG. 229 discloses that MgO and CaO fail to form, in a solid phase, a single phase in all ratios. The method disclosed in the document uses a tunnel barrier comprising the oxides mixed in a manner of combination in which the oxides fail to form, in a solid phase, a single phase or in a ratio in which the oxides fail to form, in a solid phase, a single phase. Thus, a boundary is formed in the tunnel barrier between oxide phases that fail to mix with each other. This hinders the (001) orientation of the ferromagnetic layer and MgO, thus precluding a high MR ratio from being achieved. Furthermore, the boundary between the oxide phases forms a passage for a leakage current, resulting in a reduced dielectric breakdown lifetime.

Jpn. Pat. Appln. KOKAI Publication No. 2010-109208 discloses the use, as a tunnel barrier, of MgZnO with a Zn rate of 1 to 12.5% and a thickness of 0.9 to 1.2 nm. However, the inventors expect that a thickness equivalent to at least about three periods of an MgO lattice is needed to allow the spin filter effect of the Δ1 band to be sufficiently produced to achieve a high MR ratio, but the thickness of 1.2 nm in Jpn. Pat. Appln. KOKAI Publication No. 2010-109208 is less than three periods of the MgO lattice (=1.26 nm). This is insufficient for achieving a high MR ratio.

The magnetoresistive effect element according to the above-described document uses, as a tunnel barrier, the oxides mixed in a manner of combination in which the oxides fail to form, in a solid phase, a single phase or in a ratio in which the oxides fail to form, in a solid phase, a single phase. Thus, a boundary is formed in the tunnel barrier between the oxide phases that fail to mix with each other. Thus, the (001) orientation of the ferromagnetic layer and MgO is hindered and becomes insufficient for achieving a high MR ratio. Furthermore, the amount of leakage current may increase to reduce the dielectric breakdown lifetime.

In view of the above consideration, the present embodiment uses, as a tunnel barrier, oxides mixed in a ratio in which the oxides form, in a solid phase, a single phase. This suppresses the formation of a boundary between the oxide phases in the tunnel barrier, promoting the (001) orientation of the ferromagnetic layer and MgO to achieve a high MR ratio. Furthermore, a possible leakage current is restrained to increase the dielectric breakdown lifetime.

[2. Tunnel Barrier Materials]

Materials for a tunnel barrier for use in a magnetoresistive (MTJ (Magnetic Tunnel Junction) element will be described. The materials for the tunnel barrier according to the present embodiment are roughly classified into binary nonmagnetic mixture including two types of oxides and ternary nonmagnetic mixture including three types of oxides.

[2-1. Binary Nonmagnetic Mixture]

FIG. 1 to FIG. 3 are examples of phase diagrams of oxides which form, in a solid phase, a single phase with magnesium oxide (MgO) or which, in a solid state, fail to form a single phase with MgO.

FIG. 1 is a phase diagram of a mixture MgO—$TiO_2$ of MgO and titanium oxide ($TiO_2$). In FIG. 1, the axis of abscissas represents a Ti/(Mg+Ti) concentration (mol %), and the axis of ordinate represents temperature. MgO—$TiO_2$ forms, in a solid phase, a single phase in all mixture ratios. The phase diagram (Document 92-003 described below) has no description, but the description of the phase diagram in Document 92-003 illustrates that MgO—$TiO_2$ forms, in a solid phase, a single phase in all the mixture ratios. To promote the (001) orientation by increasing the concentration of MgO, an area is particularly preferred in which a Ti/(Mg+Ti) concentration C1 is $0<C1\leq32$ mol % and in which the concentration of MgO, shown in the left of FIG. 1, is close to 100%.

FIG. 2 is a phase diagram of a mixture MgO—ZnO of MgO and zinc oxide (ZnO). In FIG. 2, the axis of abscissas represents a Zn/(Mg+Zn) concentration (mol %), and the axis of ordinate represents temperature. One type of phase (periclase solid solution) of MgO—ZnO is described in a low-temperature-side area in which the Zn/(Mg+Zn) concentration C2 is $0<C\leq44$ mol %. This indicates that ZnO forms, in a solid phase, a single phase with MgO. On the other hand, two types of phases are described in an area in which the concentration is more than 44 mol %. This indicates that ZnO fails to form, in a solid phase, a single phase. Thus, for MgO—ZnO, the area is preferred in which the Zn/(Mg+Zn) concentration C2 is $0<C2\leq44$ mol % and in which MgO—ZnO forms, in a solid phase, a single phase.

FIG. 3 is a phase diagram of a mixture MgO—$Al_2O_3$ of MgO and aluminum oxide ($Al_2O_3$). In FIG. 3, the axis of abscissas represents an Al/(Mg+Al) concentration (mol %), and the axis of ordinate represents temperature. The mixture MgO—$Al_2O_3$ is a comparative example. For MgO—$Al_2O_3$, two types of phases are described for all the mixture ratios. MgO—$Al_2O_3$ fails to form, in a solid phase, a single phase in all the mixture ratios.

FIG. 4 is a diagram showing whether MgO and each of various oxides form, in a solid phase, a single phase. A radius in FIG. 4 is a metallic bond radius (Å). Oxides are classified into a cubic system like MgO and a crystal system different from MgO. A phase diagram number in a reference is shown under each oxide. A material having no phase diagram number and for which whether or not the material forms, in a solid phase, a single phase with MgO is unknown has no reported example in the reference. Furthermore, a material having a phase diagram number but for which whether or not the material forms, in a solid phase, a single phase with MgO is unknown has no description in the phase diagram indicating whether or not the material forms, in a solid phase, a single phase with MgO.

Phase diagram references xx-yy refer to phase diagram numbers (xx denotes a volume number and yy denotes a diagram number) in the following references.

"Phase Diagrams for Ceramists", the American Ceramic Society, vol. 1 to 10, 92, 93, (1967-1993)

*1: "PHASE DIAGRAMS", vol. 4, p. 182, Academic Press (1976)

FIG. 4 shows that oxides known to form, in a solid phase, a single phase with MgO are only TiO, $TiO_2$, and manganese oxide (MnO), and ZnO and that most oxides fail to form, in a solid phase, a single phase with MgO, or for most oxides, whether or not the oxide forms, in a solid phase, a single phase with MgO is unknown. For the oxides for which whether or not the oxide forms, in a solid phase, a single phase with MgO is unknown and oxides not described in FIG. 4, if any of these oxides forms, in a solid phase, a single phase with MgO, that oxide is applicable to a tunnel barrier as a mixed oxide with MgO.

$TiO_x$ and $MnO_x$ are oxides containing metal atoms that can have several types of valences (for $TiO_x$, TiO, $TiO_2$, and the like, and for $MnO_x$, MnO, $MnO_2$, and the like). A phase diagram reference 14-11392 described in FIG. 4 indicates that, like $TiO_2$, TiO forms, in a solid phase, a single phase with MgO. A binary mixture MgXO utilizing manganese oxide or zinc oxide is applicable as the tunnel barrier according to the present embodiment even if mixtures include oxides of the metals X having several types of valences.

A mixture MgMnO of MgO and MnO forms, in a solid phase, a single phase with MgO. The mixture MgMnO is magnetic when the Mn/(Mg+Mn) concentration is more than 33 mol % in concentration. To allow the nonmagnetic mixture MgMnO to be used as a tunnel barrier, an area is preferably used in which the Mn/(Mg+Mn) concentration is more than 0 and 33 mol % or less.

Figures 5, 6:
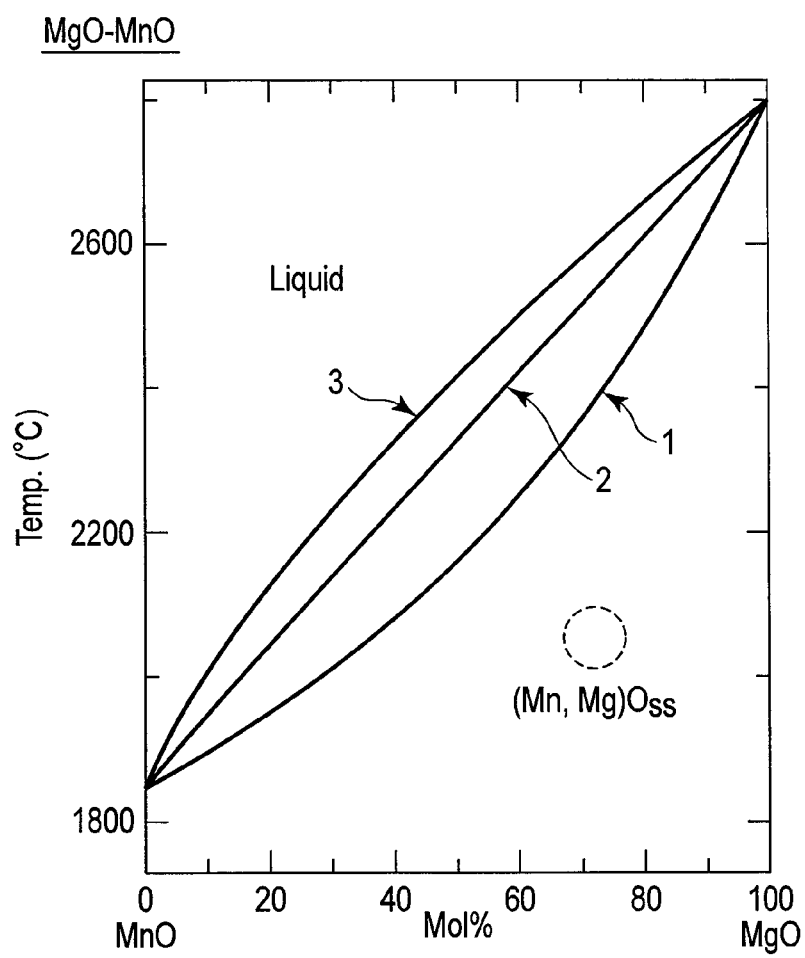
FIG. 5 is a diagram showing extracted metallic bond radii of oxides which form, in a solid phase, a single phase with MgO.
FIG. 6 is a phase diagram of a mixture MgO—MnO.

FIG. 5 is a diagram showing the extracted metallic bond radii of oxides which form, in a solid phase, a single phase with MgO. The metallic bond radii are derived from "Kagaku Binran Kisohen II, revised fifth edition, edited by The Chemical Society of Japan, published by MARUZEN Co., Ltd. (2004)".

As shown in FIG. 5, oxides TiO, $TiO_2$, MnO, and ZnO which form, in a solid phase, a single phase with MgO each have a smaller metallic bond radius than MgO. When MgO is mixed with an oxide of a metal (titanium (Ti), manganese (Mn), or zinc (Zn)) containing smaller metal atoms than Mg and forming, in a solid phase, a single phase with MgO, the lattice misfit between MgO and CoFeB (MgO is 3.8% larger than Fe (001)) is reduced to promote (001) orientation. Thus, the MR ratio is improved. On the other hand, metals Ti, Mn, and Zn which form, in a solid phase, a single phase with MgO each contain larger metal atoms than Mg. Thus, when MgO is mixed with an oxide of a metal containing larger metal atoms than Mg and forming, in a solid phase, a single phase with MgO, the mixture is expected to effectively enhance the anisotropy of an MgO/CoFeB interface to improve the magnetic characteristics of CoFeB and the MR ratio.

[2-2. Ternary Nonmagnetic Mixture]

FIG. 6 to FIG. 9 are examples of phase diagrams illustrating whether or not three types of oxides including MgO form, in a solid phase, a single phase. FIG. 6 is a phase diagram of a mixture MgO—MnO of MgO and MnO. In FIG. 6, the axis of abscissas represents an Mg/(Mg+Mn) concentration (mol %). The axis of ordinate represents temperature. In FIG. 6, "1" and "2" denote solidus and liquidus calculated from a first solution model, and "3" denotes a liquidus calculated from a second solution model.

Figure 7:
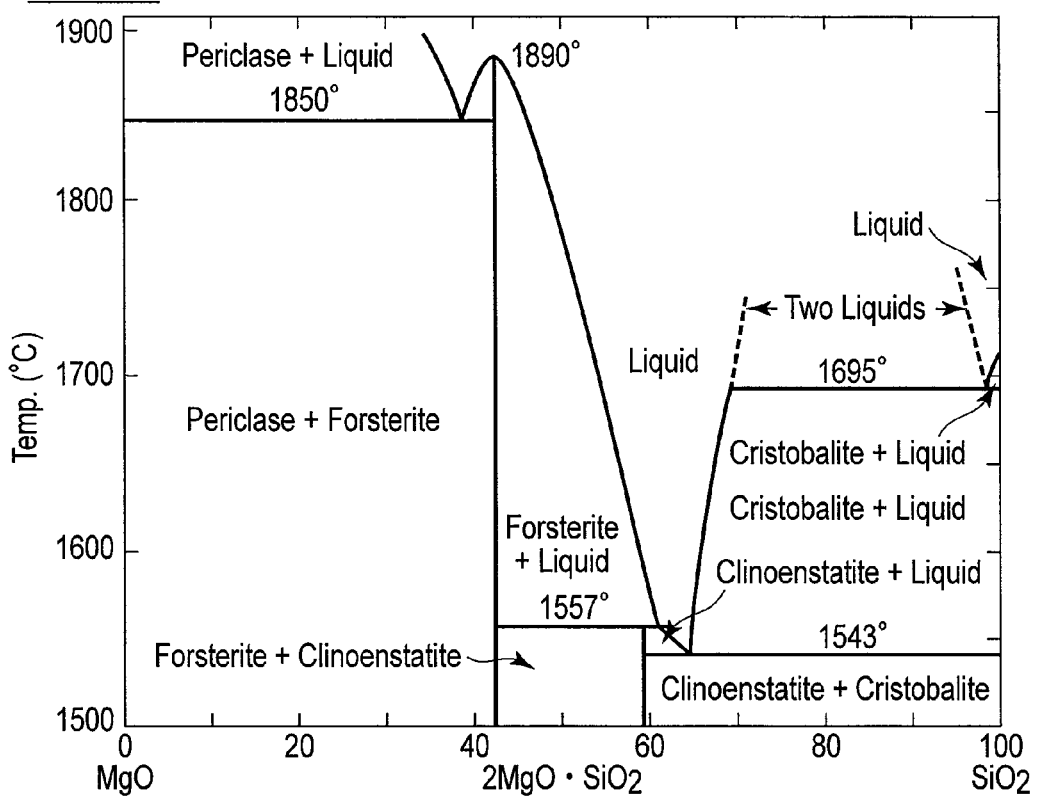
FIG. 7 is a phase diagram of a mixture $MgO-SiO_2$.
Figure 8:
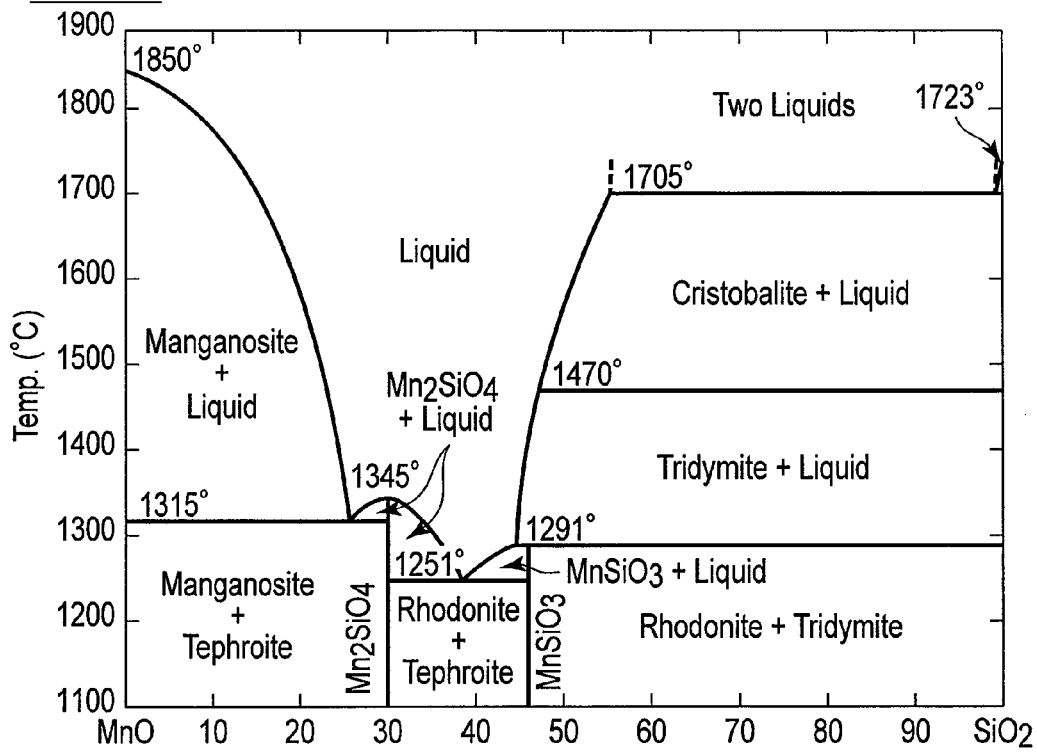
FIG. 8 is a phase diagram of a mixture $MnO-SiO_2$.
Figure 9:
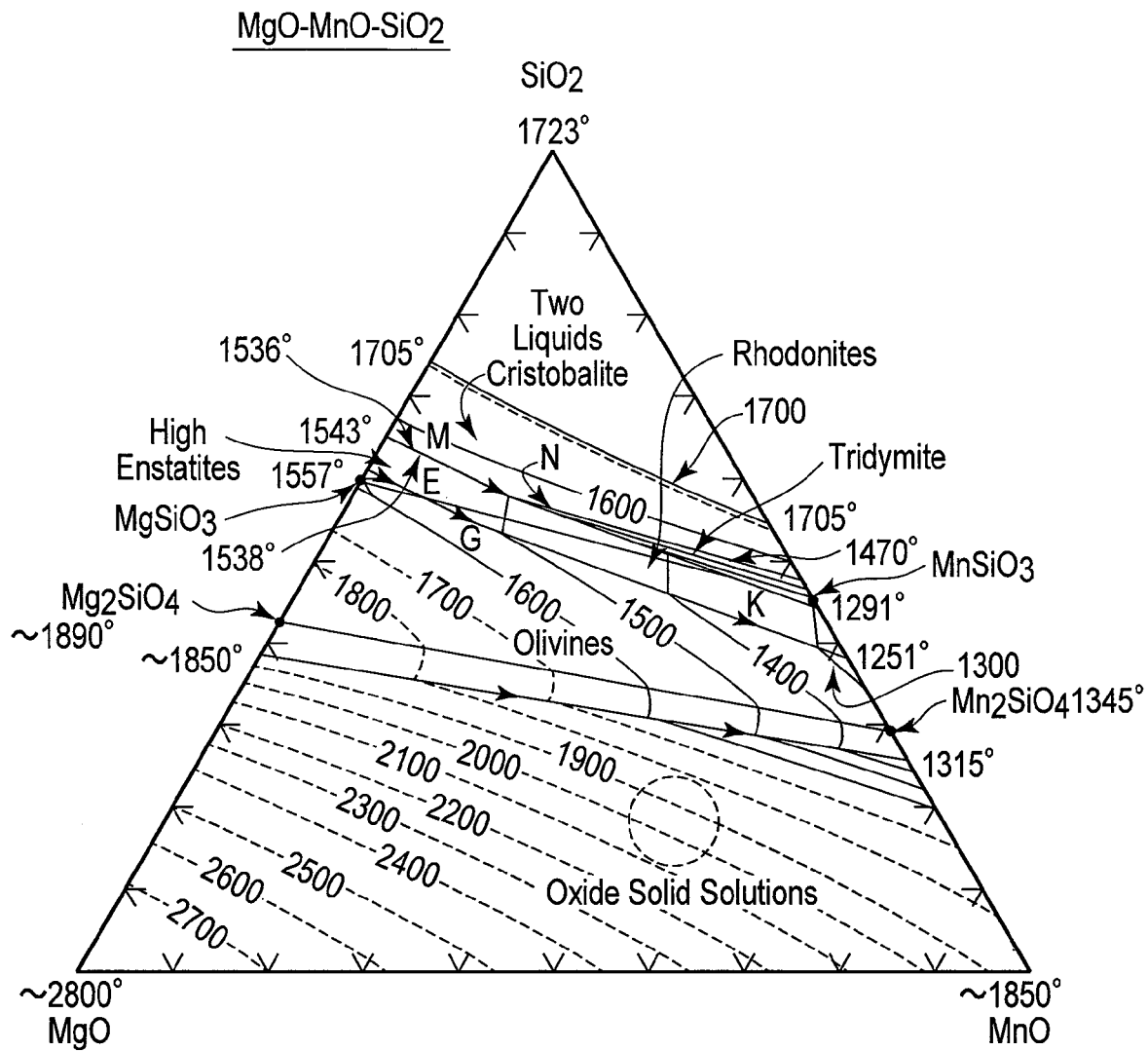
FIG. 9 is a phase diagram of a mixture MgO—MnO—$SiO_2$.

FIG. 7 is a phase diagram of a mixture MgO—$SiO_2$ of MgO and silicon oxide ($SiO_2$). In FIG. 7, the axis of abscissas represents an Si/(Mg+Si) concentration (mol %). The axis of ordinate represents temperature. FIG. 8 is a phase diagram of a mixture MnO—$SiO_2$ of MnO and $SiO_2$. In FIG. 8, the axis of abscissas represents the concentration (mol %) of Si/(Mg+Si). The axis of ordinate represents temperature. FIG. 9 is a phase diagram of a mixture MgO—MnO—$SiO_2$ of MgO, MnO, and $SiO_2$. In FIG. 9, E=ternary peritectics, N=a ternary invariant point between tridymite, cristobalite, and rhodonite solid solutions. FIG. 8 and FIG. 9 are disclosed in phase diagram references "1-101" and "1-699", respectively.

As understood from FIG. 6, MgO—MnO forms, in a solid phase, a single phase in all mixture ratios. On the other hand, each of MgO—$SiO_2$ and MnO—$SiO_2$ fails to form, in a solid phase, a single phase in all the mixture ratios, as understood from FIG. 7 and FIG. 8. The phase diagram of the three types of oxides in FIG. 9 shows that each of MgO and MnO forms, in a solid phase, a single phase in a high-concentration area. The results shown in FIG. 6 to FIG. 9 indicate as follows. When MgO is assumed to be "water" and $SiO_2$, which fails to form, in a solid phase, a single phase with MgO alone, is assumed to be oil, the "water" and the "oil" can be mixed together by using MnO, which forms, in a solid phase, a single phase with MgO, as "soap". Thus, the three types of oxides can be formed, in a solid phase, into a single phase.

As shown in FIG. 4, many cubic oxides like MgO fail to form, in a solid phase, a single phase with MgO, or for many cubic oxides, whether or not these oxides form, in a solid phase, a single phase with MgO is unknown. When a mixture of MgO and a cubic oxide like MgO is mixed with an oxide which forms, in a solid phase, a single phase with either MgO or the cubic oxide, the three types of oxides are formed, in a solid phase, into a single phase. That is, the cubic system of MgO can be maintained, and the lattice constant of MgO can be changed without forming a boundary between the oxide phases. When the cubic oxide like MgO has a smaller lattice constant than MgO, the lattice misfit between MgO and CoFeB is reduced to promote the (001) orientation. Thus, the MR ratio is improved. On the other hand, when MgO is mixed with a cubic oxide like MgO having a larger lattice constant than MgO, the mixture is expected to effectively increase the lattice misfit between MgO and CoFeB to enhance the magnetic anisotropy of the MgO/CoFeB interface, thus improving the magnetic characteristics of CoFeB and the MR ratio.

Figure 9A:
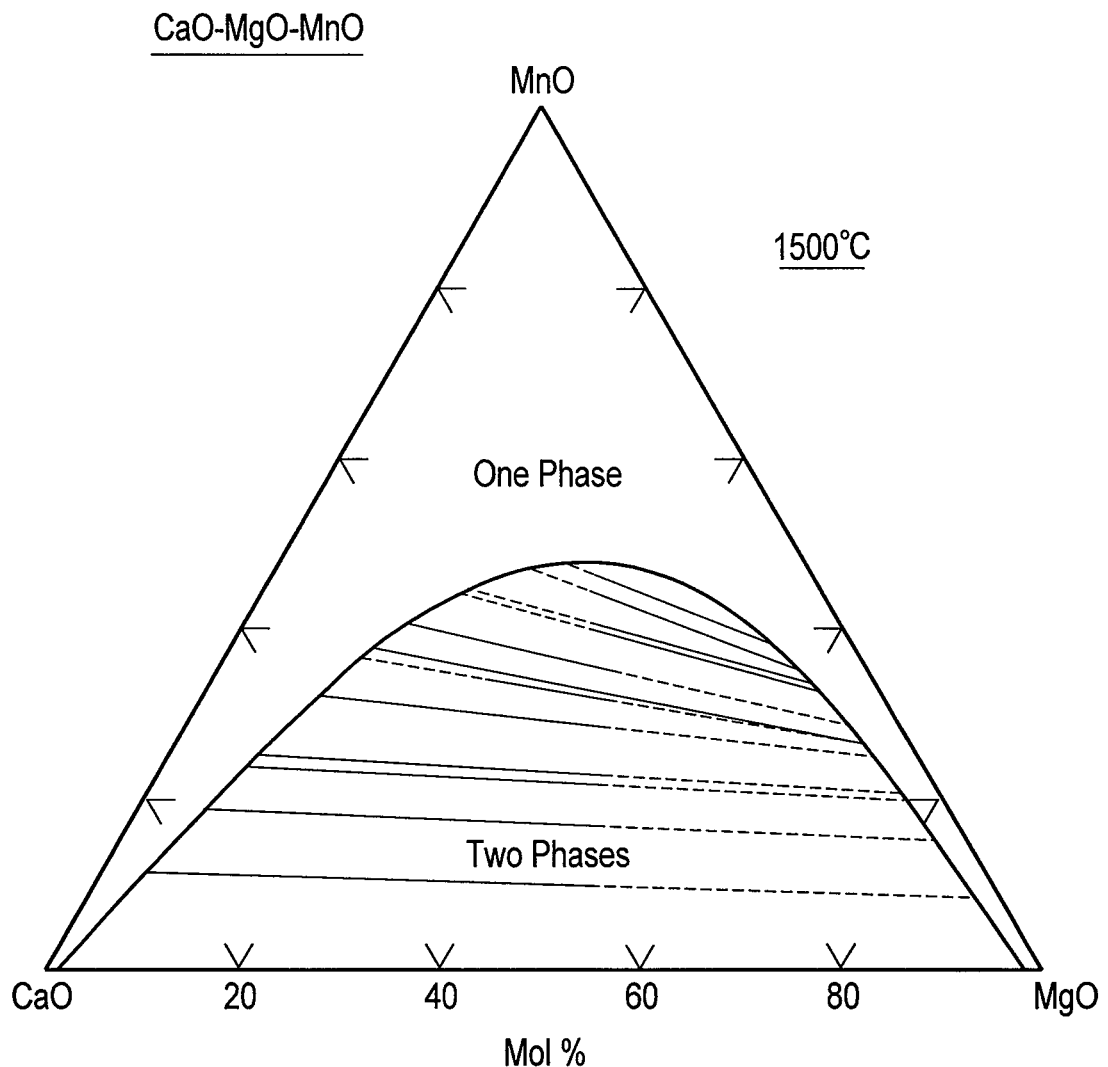
FIG. 9A is a phase diagram of a mixture CaO—MgO—MnO.

FIG. 9A is a phase diagram of a mixture CaO—MgO—MnO of calcium oxide (CaO), magnesium oxide (MgO), and manganese oxide (MnO). The phase diagram of the mixture CaO—MgO—MnO is described in a phase diagram reference 4-5374. The mixture CaO—MgO—MnO forms, in a solid phase, a single phase when the concentration rate of CaO is lower than all the concentration rates of MgO and MnO.

FIG. 10 is a diagram illustrating whether or not three types of oxides including MgO form, in a solid phase, a single phase, based on the above discussions. FIG. 10 also shows the lattice misfit between CoFeB and a cubic oxide XO (an oxide of an element X) like MgO. FIG. 10 shows whether or not XO—YO and MgO—XO—YO form, in a solid phase, a single phase if $TiO_2$, ZnO, or MnO is used as an oxide YO which forms, in a solid phase, a single phase with MgO. Not only if Mg—XO—YO forms, in a solid phase, a single phase with MgO (circles and oblique hatching in FIG. 10) but also for oxides having no phase diagram at present and for which whether or not the oxide forms, in a solid phase, a single phase is unknown (sand hatching in FIG. 10), there is a possibility that a tunnel barrier in a single phase will be formed. Any oxide which forms, in a solid phase, a single phase with MgO is applicable to a tunnel barrier as a mixed oxide with MgO.

For a ternary nonmagnetic mixture MgXYO, MgO desirably has a concentration of 50 mol % or more in order to maintain the (001) orientation with CoFeB to achieve a high MR ratio.

In summary, the tunnel barrier according to the present embodiment contains the ternary nonmagnetic mixture MgXYO comprising MgO, a cubic metal oxide XO like MgO, and a metal oxide YO which forms, in a solid phase, a single phase with MgO or the cubic metal oxide XO. An element X=calcium (Ca), scandium (Sc), titanium (Ti), vanadium (V), chromium (Cr), manganese (Mn), iron (Fe), cobalt (Co), nickel (Ni), copper (Cu), strontium (Sr), niobium (Nb), cadmium (Cd), antimony (Sb), barium (Ba), cerium (Ce), or europium (Eu). A metal element Y=titanium (Ti), zinc (Zn), or manganese (Mn) (X≠Y). Alternatively, the tunnel barrier contains the ternary nonmagnetic mixture MgXYO comprising MgO, a cubic metal oxide XO like MgO which is silicon oxide ($SiO_2$), and a metal oxide YO which forms, in a solid phase, a single phase with MgO or $SiO_2$.

For example, in FIG. 9, an area covering MgO:$SiO_2$="10:0" to about "6:4" corresponds to a single phase in a solid phase (oxide solid solutions). Thus, an (X+Y)/(Mg+X+Y) concentration in the ternary nonmagnetic mixture MgXYO, that is, a set of the oxides other than MgO, is preferably more than 0 and at most 40 mol % in concentration.

An oxide XO having a smaller lattice constant than MgO reduces the lattice misfit between MgO and CoFeB (the absolute value of the lattice misfit is smaller than 3.8%) to promote the (001) orientation, thus increasing the MR ratio. On the other hand, an oxide XO having a larger lattice constant than MgO increases the lattice misfit between MgO and CoFeB (the absolute value of the lattice misfit is larger than 3.8%) to enhance the magnetic anisotropy of the MgO/CoFeB interface, thus improving the magnetic characteristics of CoFeB and the MR ratio.

[3. Experimental Results]

Figure 12:
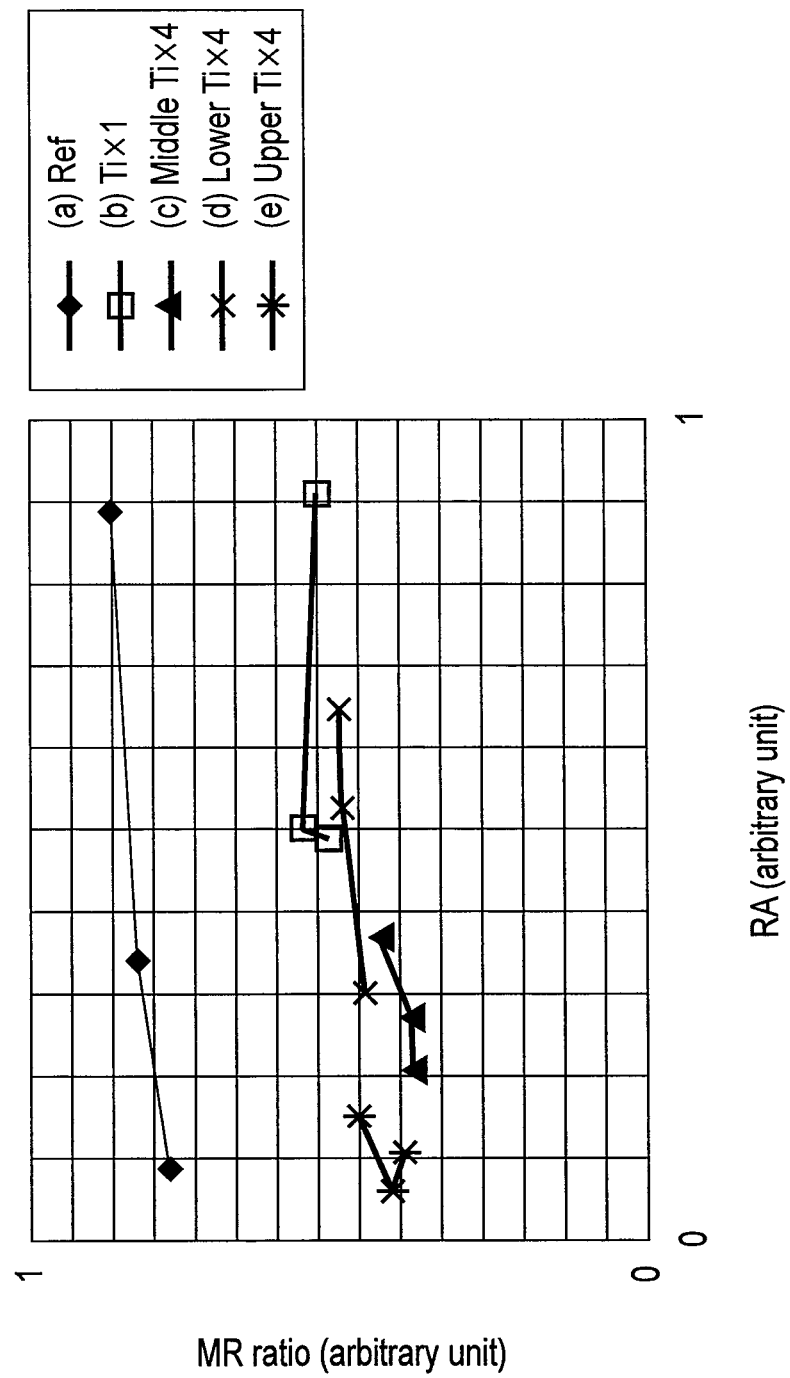
FIG. 12 is a graph showing the relations between a tunnel resistivity and an MR ratio for the MTJ element in FIG. 11.

Now, the results of experiments on a magnetoresistive effect element (MTJ element) with the tunnel barrier according to the present embodiment will be described. FIG. 11 is a schematic diagram illustrating methods for manufacturing the MTJ element used in the experiments. FIG. 11 shows five types of manufacturing methods (a) to (e). FIG. 12 is a graph showing the relations between a tunnel resistivity RA ($\Omega \cdot \mu m^2$) and the MR ratio for the MTJ element manufactured by the manufacturing method in FIG. 1. (a) to (e) in FIG. 12 correspond to the experimental results (a) to (e) in FIG. 11. Furthermore, the numerical values on the axis of ordinate and the axis of abscissas are expressed in terms of relative ratio.

In FIG. 11, two ferromagnetic layers sandwiching a tunnel barrier between the layers comprise, for example, a CoFeB layer. FIG. 11(a) shows reference data regarding a tunnel barrier comprising MgO. FIG. 11(b) shows an Mg film (thickness=5 Å), a Ti film (thickness=1 Å), and an Mg film (thickness=5 Å) stacked in this order on a CoFeB underlayer. FIG. 11(c) shows Mg films (thickness=2 Å) and Ti films (thickness=0.25 Å) alternately stacked with an Mg film (thickness=2 Å) stacked in the uppermost layer. FIG. 11(d) shows Ti films (thickness=0.25 Å) and Mg films (thickness=2.5 Å) alternately stacked. FIG. 11(e) shows Mg films (thickness=2.5 Å) and Ti films (thickness=0.25 Å) alternately stacked. Subsequently, an oxidation step is carried out on all of the structures in FIG. 11(a) to FIG. 11(e). An Mg film (thickness=4 Å) is deposited on each of the structures as a cap layer.

Furthermore, in the manufacturing steps for FIG. 11(b) to FIG. 11(e), three types of oxidation steps were carried out on the stack film of the Mg films and the Ti films to form an MTJ element comprising an MgTiO film as a tunnel barrier. The three types of oxidation steps involved $O_2$ oxidation (samples were exposed to an oxygen ambient) in which three patterns with oxidation times of 120, 150, and 180 sec, respectively, were applied. Three points on each graph in FIG. 12 correspond to the oxidation times of 120, 150, and 180 sec, respectively. Basically, both the tunnel resistivity RA and the MR ratio increase consistently with the oxidation time. Additionally, the total thickness of the Mg films and the Ti films is the same for FIG. 12(b) to FIG. 12(e). The structures in FIG. 12(b) to FIG. 12(e) have a lower MR ratio than Ref (no Ti film) in FIG. 12(a). In these structures, unoxidized Ti films are expected to have disturbed the (001) orientation of MgO to reduce the MR ratio.

The structure in FIG. 12(c) is lower in both the RA and MR ratio than the structure in FIG. 12(b). This suggests that even when the Ti film was divided, the oxidation of the Ti films was not promoted, and unoxidized Ti films remained.

The structure in FIG. 12(d) is higher in both the RA and MR ratio than the structure in FIG. 12(c). The Ti film in the lowermost layer in FIG. 12(d) in contact with the CoFeB underlayer is expected to effectively oxidize the Ti film.

The structure in FIG. 12(e) has a lower RA and a higher MR ratio than the structure in FIG. 12(c). The Ti film in the uppermost layer exposed to the oxygen ambient is expected to promote the oxidation of the Ti film to increase the MR ratio. The reason for the decrease in the RA is unknown. However, if the Ti film in the uppermost layer is assumed to be the first to be oxidized, the Ti oxide in the uppermost layer is expected to suppress the subsequent downward diffusion of oxidizing species and thus the oxidation of the Mg films and Ti films below the Ti film in the uppermost layer, reducing the RA.

FIG. 13 is a schematic diagram illustrating the experimental results in FIG. 11(c). In FIG. 11(c), the Ti film has a small thickness, and thus, Ti in the Mg film is no longer a horizontally spreading film but is shaped like an island as shown in FIG. 13. Electrons migrate from readily oxidizable Mg to not easily oxidizable Ti. Ti is negatively charged ($\delta-$) and becomes hardly to react with negatively charged oxidizing species such as $O_2^-$ (the oxidizing species is expected to receive electrons on a surface of an oxidation target and to be negatively charged). Ti is thus expected to remain unoxidized after the oxidation.

FIG. 14 is a schematic diagram illustrating the results of the experiment in FIG. 11(d). The reason why the structure in FIG. 11(d) is higher in both the RA and MR ratio than the structure in FIG. 11(c) is thought to be as follows. The Ti film in the lowermost layer in FIG. 11(d) is in contact with the CoFeB underlayer. Thus, as shown in FIG. 14, electrons migrate from Ti to less easily oxidizable Co and Fe, and Ti is positively charged and reacts more easily with negatively charged oxidizing species. This is expected to have promoted the oxidation of Ti.

FIG. 15 is a schematic diagram illustrating the results of the experiment in FIG. 11(e). The reason why the structure in FIG. 11(e) has a higher MR ratio than the structure in FIG. 11(c) is thought to be as follows. As shown in FIG. 15, electrons migrate from readily oxidizable Mg to less easily oxidizable Ti, and Ti is negatively charged and becomes difficult to oxidize. However, Ti is peripherally exposed to the oxygen ambient, which promotes the oxidation of Ti.

FIG. 16 is a diagram showing standard electrode potentials as an index for selecting a manufacturing method by checking which of metal materials in contact with each other is more easily oxidizable. FIG. 16 is based on a document "CRC handbook of Chemistry and Physics", 83rd Edition, CRC Press (2002). If a metal material has a plurality of standard electrode potentials, a smaller (more negative) numerical value with which the material more easily oxidizes is used. The standard electrode potential is the result of examination of the properties of each metal material as a solid based on the potential difference between electrodes immersed in water at a temperature close to room temperature. The inventors expect that since a solid is an aggregate of atoms, the standard electrode potential can be used as a relative indicator, for each metal material, of the likelihood of being oxidized, even for an island-like mass of a small number of atoms or a single atom and for oxidation conditions such as various temperatures and pressures.

If a nonmagnetic mixture MgXO of MgO and a metal oxide XO with a composition which forms, in a solid phase, a single phase with MgO is used as a tunnel barrier, at least one of Mg and the metal X which has a higher standard electrode potential receives electrons and is negatively charged ($\delta-$), and hence is not easily oxidizable by a negatively charged oxidizing species. In a manufacturing method of depositing Mg and the metal X on a substrate (ferromagnetic layer) and carrying out post-oxidation, one of Mg and the metal X which is less easily oxidizable remains unoxidized as suggested by the results of the experiments in FIG. 11. Thus, the method for manufacturing the magnetoresistive effect element is preferably a deposition method of depositing an oxide of at least one of Mg and the metal X which has a higher standard electrode, on the ferromagnetic layer. Alternatively, the deposition method may involve depositing oxides of both Mg and the metal X on the ferromagnetic layer in view of the possibility that, if a readily oxidizable metal and an oxide of a not easily oxidizable metal are deposited, oxygen atoms migrate from the oxide of the not easily oxidizable metal to the readily oxidizable metal.

The results of the experiments in FIG. 11 reflect the difference in the likelihood of being oxidized, in the minimum difference in standard electrode difference (between Mg and Ti). Thus, particularly when the difference in standard electrode potential between Mg and the metal X is equal to or larger than 1.07 V, the not easily oxidizable metal can be more effectively prevented from remaining unoxidized by using the deposition method of depositing an oxide of at least one of Mg and the metal X which has a higher standard electrode potential, on the ferromagnetic layer.

FIG. 17 is a diagram showing the standard electrode potentials of Mg, the metal X, and the metal Y (Ti, Zn, or Mn) for the nonmagnetic mixture MgO—XO—YO (YO=$TiO_2$, ZnO, or MnO) shown in FIG. 10. In a manufacturing method of depositing Mg, the metal X, and the metal Y on the ferromagnetic layer and carrying out post-oxidation, the least easily oxidizable metal remains unoxidized. Thus, the method for manufacturing the magnetoresistive effect element is preferably a deposition method of depositing, on the ferromagnetic layer, an oxide of at least one of Mg, the metal X, and the metal Y which has the highest standard electrode potential and which is less easily oxidizable (oblique hatching in FIG. 17). More preferably, the deposition method involves depositing oxides of the two types of metals different from the most readily oxidizable metal, on the ferromagnetic layer. Alternatively, the deposition method may involve depositing oxides of all of Mg, the metal X, and the metal Y on the ferromagnetic layer in view of the possibility that, if a readily oxidizable metal and an oxide of a not easily oxidizable metal are deposited, oxygen atoms migrate from the oxide of the not easily oxidizable metal to the readily oxidizable metal. The manufacturing method taking the standard electrode potential into account is applicable to a case where X is a nonmetal (Si).

The results of the experiments in FIG. 11 reflect the difference in the likelihood of being oxidized in the maximum difference of 1.07 V in standard electrode potential. Thus, in particular, for those of the combinations of Mg, the metal X, and the metal Y shown in FIG. 17 in which the metals are different from one another in standard electrode potential by 1.07 V or higher, the not easily oxidizable metal can be more effectively prevented from remaining unoxidized by using a deposition method of depositing, on the ferromagnetic layer, an oxide of at least the metal having a high standard electrode potential and which is not easily oxidizabl.

[4. Arrangement of Magnetoresistive Effect Element]

The magnetoresistive effect element (MTJ element) and a manufacturing method thereof according to this embodiment will be explained in more detail below.

FIG. 18 is a sectional view of an MTJ element 100. The MTJ element 100 is formed on a lower interconnection layer 101. The MTJ element 100 is obtained by stacking an underlayer 102, a memory layer 103, a tunnel barrier 104 to which this embodiment is applied, a reference layer 105, and an upper layer 106 in this order. The memory layer 103 and reference layer 105 can also be stacked in the reverse order. The planar shape of the MTJ element 100 is not particularly restricted, and is, e.g., a circle or ellipse.

The memory layer 103 and reference layer 105 are ferromagnetic layers and have magnetic anisotropy perpendicular to the film surfaces, and the directions of easy magnetization in these layers are perpendicular to the film surfaces. That is, the MTJ element 100 is a perpendicular magnetization MTJ element in which the magnetization directions in the memory layer 103 and reference layer 105 are perpendicular to the film surfaces. Note that the MTJ element 100 may also be an in-plane magnetization MTJ element in which the magnetization directions in the memory layer 103 and reference layer 105 point in the in-plane direction.

In the memory layer 103, the magnetization direction is variable (reverses). In the reference layer 105, the magnetization direction is invariable (fixed). The reference layer 105 is so designed as to have much higher perpendicular magnetic anisotropic energy than that of the memory layer 103. The magnetic anisotropy can be set by adjusting the material constitution or thickness. Thus, a magnetization switching current of the memory layer 103 is reduced and made smaller than that of the reference layer 105. This makes it possible to implement the MTJ element 100 including the memory layer 103 having a variable magnetization direction and the reference layer 105 having an invariable magnetization direction with respect to a predetermined write current.

Each of the memory layer 103 and reference layer 105 is made of, e.g., CoFeB obtained by adding boron (B) to an alloy containing cobalt (Co) and iron (Fe).

The underlayer 102 is made of a nonmagnetic material, and formed to control the crystal orientation of the memory layer 103. The upper layer 106 is made of a metal or the like, and used as a mask when processing the MTJ element 100. The upper layer 106 may also be formed to function as an upper electrode.

This embodiment adopts a spin-transfer torque writing method by which a write current is directly supplied to the MTJ element 100 and the magnetization state of the MTJ element 100 is controlled by this write current. The MTJ element 100 can take one of a low-resistance state and high-resistance state in accordance with whether the relative relationship between the magnetization directions in the memory layer 103 and reference layer 105 is parallel or antiparallel.

When a write current flowing from the memory layer 103 to the reference layer 105 is supplied to the MTJ element 100, the relative relationship between the magnetization directions in the memory layer 103 and reference layer 105 becomes parallel. In this parallel state, the resistance value of the MTJ element 100 is lowest, and the MTJ element 100 is set in the low-resistance state. This low-resistance state of the MTJ element 100 is defined as, e.g., data "0".

On the other hand, when a write current flowing from the reference layer 105 to the memory layer 103 is supplied to the MTJ element 100, the relative relationship between the magnetization directions in the memory layer 103 and reference layer 105 becomes antiparallel. In this antiparallel state, the resistance value of the MTJ element 100 is highest, and the MTJ element 100 is set in the high-resistance state. This high-resistance state of the MTJ element 100 is defined as, e.g., data "1".

This makes the MTJ element 100 usable as a memory element capable of storing one-bit data (binary data). It is possible to freely set the resistance states and data allocation of the MTJ element 100.

When reading data from the MTJ element 100, a read voltage is applied to the MTJ element 100, and the resistance value of the MTJ element 100 is detected based on a read current flowing through the MTJ element 100. The read voltage is set at a value much smaller than a threshold at which magnetization reversal occurs due to spin-transfer torque.

(Manufacturing Method)

Now, a method for manufacturing an MTJ element will be described. First, as shown in FIG. 19, an underlayer 102, a memory layer 103, a tunnel barrier 104 to which the present embodiment is applied, a reference layer 105, and an upper layer 106 are deposited in order on a lower interconnection layer 101.

The tunnel barrier 104 uses, as a binary oxide which forms, in a solid phase, a single phase, for example, (a) MgTiO having a Ti/(Mg+Ti) concentration of more than 0 and 32 mol % or less, (b) MgMnO having an Mn/(Mg+Mn) concentration of more than 0 and 33 mol % or less, or (c) MgZnO having a Zn/(Mg+Zn) concentration of more than 0 and 44 mol % or less. The tunnel barrier 104 has a thickness equivalent to at least 2 periods of an MgO lattice=0.84 nm. More preferably, the tunnel barrier 104 has a thickness of 1.26 to 3.37 nm, which is equivalent to 3 to 8 periods of the MgO lattice in order to sufficiently exert the spin filter effect of a Δ1 band and to achieve a high MR ratio at a practical barrier resistance value.

Methods for forming the tunnel barrier 104 are illustrated below. A nonmagnetic mixture is denoted by XYO, two types of oxides are denoted by XO and YO, and two types of metals are denoted by X and Y.

(1) Direct sputtering of a mixed oxide (nonmagnetic mixture XYO) target by RF (radio frequency)

(2) Simultaneous sputtering of a plurality of pure oxides (oxides XO and YO)

(3) After simultaneous sputtering of a plurality of metal (metals X and Y) targets, post-oxidation is performed using oxygen gas, oxygen plasma, oxygen radical, or ozone (4) After simultaneous sputtering of the metal X and the oxide YO, post-oxidation is performed on the unoxidized metal X (5) One of an MBE (Molecular Beam Epitaxy) method, an atomic layer deposition (ALD) method, and a chemical vapor deposition (CVD) method, or any other method The tunnel barrier 104 may be a nonmagnetic mixture comprising MgO, a cubic oxide, and a metal oxide which forms, in a solid phase, a single phase with MgO or the cubic oxide as shown in FIG. 10.

A method for manufacturing the tunnel barrier 104 is preferably a deposition method of depositing, on the ferromagnetic layer, an oxide of at least a metal having the highest standard electrode potential and which is not easily oxidizabl. This is effective for preventing the not easily oxidizabl metal from remaining unoxidized. If the metal X and the metal Y differ significantly from each other in standard electrode potential and the metal Y is not easily oxidizabl, any of the methods other than the method (3), that is, any of the methods (1), (2), and (4) is desirably used.

Subsequently, as shown in FIG. 20, the underlayer 102, the memory layer 103, the tunnel barrier 104, the reference layer 105, and the upper layer 106 are selectively etched on the lower interconnection layer 101 by, for example, an ion milling method.

Subsequently, as shown in FIG. 21, an insulating layer 107 intended to protect the MTJ element during the next step is formed by, for example, a sputtering method, a CVD method, or an ALD method. The insulating layer 107 may be, for example, silicon nitride (SiN), silicon oxide ($SiO_x$), magnesium oxide (MgO), or aluminum oxide ($AlO_x$). Subsequently, for example, the lower interconnection layer 101 is selectively etched by, for example, reactive ion etching (RIE). Processed portions of the lower interconnection layer 101 are, for example, the front and back sides of the drawing surface of FIG. 21, and are not shown in FIG. 21. In this case, the MTJ element 100 is protected by the insulating layer 107.

Subsequently, as shown in FIG. 22, an insulating layer 108 is formed by, for example, the sputtering method or the CVD method. The insulating layer 108 may be, for example, silicon oxide ($SiO_x$).

Subsequently, as shown in FIG. 23, the insulating layer 108 is etched back by, for example, a chemical mechanical polishing (CMP) method or a vapor phase etching method to expose an upper surface of the upper layer 106.

Subsequently, as shown in FIG. 24, an insulating layer 109 is formed, and a contact hole 110 is opened above the MTJ element 100 by, for example, the RIE method. The insulating layer 109 may be, for example, silicon oxide ($SiO_x$).

Subsequently, as shown in FIG. 18, an upper interconnection layer 111 is formed on the MTJ element 100 and then selectively etched by, for example, the RIE method. Thus, a memory cell vicinity portion including the MTJ element is manufactured.

[5. Effects]

As described above in detail, the present embodiment uses a binary mixture comprising MgO and a metal oxide which forms, in a solid phase, a single phase, as a tunnel barrier for a magnetoresistive effect element. Alternatively, the tunnel barrier for the magnetoresistive effect element is a ternary mixture comprising MgO, a cubic oxide XO, and a metal oxide YO which forms, in a solid phase, a single phase with MgO or the oxide XO. This enables formation of a boundary between the oxide phases in the tunnel barrier to be suppressed. Thus, the (001) orientation of the ferromagnetic layer and MgO can be promoted to improve the MR ratio. Furthermore, a possible leakage current is suppressed to increase the dielectric breakdown lifetime.

Each of above described MTJ structures can be introduced as MTJ elements of memory cells. Memory cells, memory cell arrays and memory devices is disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
   a first ferromagnetic layer;
   a tunnel barrier provided on the first ferromagnetic layer; and
   a second ferromagnetic layer provided on the tunnel barrier,
   wherein the tunnel barrier includes a nonmagnetic mixture containing MgO and a metal oxide with a composition which forms, in a solid phase, a single phase with MgO, and
   wherein the nonmagnetic mixture is
   (a) MgTiO having a Ti/(Mg +Ti) concentration of more than 0 and 32 mol % or less,
   (b) MgMnO having an Mn/(Mg +Mn) concentration of more than 0 and 33 mol % or less, or
   (c) MgZnO having a Zn/(Mg +Zn) concentration of more than 0 and 44 mol % or less.

2. The element of claim 1, wherein the first ferromagnetic layer includes an alloy containing Co and Fe.

3. A magnetoresistive effect element comprising:
a first ferromagnetic layer;
a tunnel barrier provided on the first ferromagnetic layer; and
a second ferromagnetic layer provided on the tunnel barrier,
wherein the tunnel barrier includes a nonmagnetic mixture containing MgO, a cubic oxide, and a metal oxide which forms, in a solid phase, a single phase with MgO or the cubic oxide.

4. The element of claim 3, wherein when the nonmagnetic mixture is denoted by MgXYO, the cubic oxide is denoted by XO, and the metal oxide is denoted by YO, X=Si, Ca, Sc, Ti, V, Cr, Mn, Fe, Co, Ni, Cu, Sr, Nb, Cd, Sb, Ba, Ce, or Eu, and Y=Ti, Zn, or Mn (X≠Y).

5. The element of claim 4, wherein an (X+Y)/(Mg+X+Y) concentration is more than 0 and 40 mol % or less.

6. The element of claim 3, wherein the first ferromagnetic layer includes an alloy containing Co and Fe.

7. A manufacturing method of a magnetoresistive effect element, comprising:
forming a tunnel barrier on a first ferromagnetic layer; and
forming a second ferromagnetic layer on the tunnel barrier,
wherein the tunnel barrier includes a nonmagnetic mixture MgXO containing MgO and a metal oxide XO with a composition which forms, in a solid phase, a single phase with MgO, and
the forming the tunnel barrier includes depositing, on the first ferromagnetic layer, an oxide of one of Mg and a metal X, which has a higher standard electrode potential.

8. The method of claim 7, wherein the nonmagnetic mixture is MgTiO, MgMnO, or MgZnO.

9. The method of claim 8, wherein
(a) when the nonmagnetic mixture is MgTiO, a titanium oxide is deposited on the first ferromagnetic layer,
(b) when the nonmagnetic mixture is MgMnO, a manganese oxide is deposited on the first ferromagnetic layer, and
(c) when the nonmagnetic mixture is MgZnO, a zinc oxide is deposited on the first ferromagnetic layer.

10. The method of claim 8, wherein
MgTiO has a Ti/(Mg+Ti) concentration of more than 0 and 32 mol % or less,
MgMnO has an Mn/(Mg+Mn) concentration of more than 0 and 33 mol % or less, and
MgZnO has a Zn/(Mg +Zn) concentration of more than 0 and 44 mol % or less.

11. The method of claim 7, wherein the first ferromagnetic layer includes an alloy containing Co and Fe.

* * * * *